US012749547B2

(12) United States Patent
Lin et al.

(10) Patent No.: US 12,749,547 B2
(45) Date of Patent: Sep. 29, 2026

(54) HIGH-DENSITY AND HIGH-VOLTAGE-TOLERABLE PURE CORE MEMORY CELL

(71) Applicant: Taiwan Semiconductor Manufacturing Company, Ltd., Hsinchu (TW)

(72) Inventors: Ku-Feng Lin, New Taipei City (TW); Perng-Fei Yuh, Walnut Creek, CA (US); Meng-Sheng Chang, Chu-bei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 101 days.

(21) Appl. No.: 18/787,706

(22) Filed: Jul. 29, 2024

(65) Prior Publication Data

US 2024/0386977 A1 Nov. 21, 2024

Related U.S. Application Data

(62) Division of application No. 17/587,242, filed on Jan. 28, 2022, now Pat. No. 12,148,487.

(60) Provisional application No. 63/230,619, filed on Aug. 6, 2021.

(51) Int. Cl.
*G11C 17/16* (2006.01)

(52) U.S. Cl.
CPC .................................. *G11C 17/16* (2013.01)

(58) Field of Classification Search
CPC ..................................................... G11C 17/16
USPC ........................................................... 365/96
See application file for complete search history.

(56) References Cited

U.S. PATENT DOCUMENTS

| | | | | |
|---|---|---|---|---|
| 6,215,691 | B1 | 4/2001 | Kim et al. | |
| 10,665,281 | B1 * | 5/2020 | Jacob | G11C 11/1653 |
| 11,770,936 | B1 * | 9/2023 | Dokania | H10B 53/40<br>257/295 |
| 12,387,779 | B2 * | 8/2025 | Wang | G11C 11/4094 |
| 2001/0004236 | A1 * | 6/2001 | Letkomiller | B60C 23/20<br>340/595 |
| 2009/0219092 | A1 * | 9/2009 | Kim | H03F 3/45188<br>330/252 |
| 2010/0259976 | A1 | 10/2010 | Abedifard | |

(Continued)

FOREIGN PATENT DOCUMENTS

| | | | |
|---|---|---|---|
| CN | 102332300 | A | 1/2012 |
| TW | 200418025 | A | 9/2004 |

(Continued)

OTHER PUBLICATIONS

Non-Final Office Action on U.S. Appl. No. 17/587,242 Dtd Jan. 19, 2024.

(Continued)

*Primary Examiner* — Muna A Techane
(74) *Attorney, Agent, or Firm* — Foley & Lardner LLP

(57) ABSTRACT

In some aspects of the present disclosure, a memory circuit is disclosed. In some aspects, the memory circuit includes a first storage element coupled to a first bit line, a first transistor coupled between the first storage element and a center node, a second storage element coupled to a second bit line, a second transistor coupled between the second storage element and the center node, and a third transistor coupled between the center node and a reference node.

20 Claims, 21 Drawing Sheets

(56) References Cited

U.S. PATENT DOCUMENTS

| | | | | |
|---|---|---|---|---|
| 2011/0103120 | A1* | 5/2011 | Hong | G11C 15/04 365/49.17 |
| 2011/0205802 | A1* | 8/2011 | Choe | G11C 11/5642 365/185.18 |
| 2015/0109851 | A1 | 4/2015 | Higo et al. | |
| 2016/0225413 | A1 | 8/2016 | Liaw | |
| 2017/0047116 | A1 | 2/2017 | Sandhu et al. | |
| 2017/0133092 | A1* | 5/2017 | Gupta | G11C 11/005 |
| 2019/0371399 | A1* | 12/2019 | Haukness | G11C 13/0002 |
| 2020/0211638 | A1 | 7/2020 | Raad et al. | |
| 2022/0166309 | A1* | 5/2022 | Maruyama | H02M 1/0022 |

FOREIGN PATENT DOCUMENTS

| | | | |
|---|---|---|---|
| TW | 201019516 | A | 5/2010 |
| TW | 201301285 | A | 1/2013 |
| TW | 201916325 | A | 4/2019 |

OTHER PUBLICATIONS

Notice of Allowance on U.S. Appl. No. 17/587,242 Dtd Jul. 22, 2024.

Taiwan Office Action issued in connection with TW Appl. Ser. No. 111112029 dated Jan. 6, 2023 (without English translation).

Office Action issued in Chinese Appl. No. 202210646306.9 dated May 21, 2025.

* cited by examiner

140

700

HIGH-DENSITY AND HIGH-VOLTAGE-TOLERABLE PURE CORE MEMORY CELL

CROSS-REFERENCE TO RELATED APPLICATION

This application is a divisional application of U.S. patent application Ser. No. 17/587,242, filed Jan. 28, 2022, which claims priority under 35 U.S. § 119(e) the U.S. Provisional Patent Application No. 63/230,619, filed Aug. 6, 2021, the entire contents of each of which are incorporated herein by reference for all purposes.

BACKGROUND

Memory circuits including eFuse, anti-fuse, and some emerging memories usually require high voltage to program the memory cells. The memory peripheral circuits and arrays are under voltage stress during programming.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
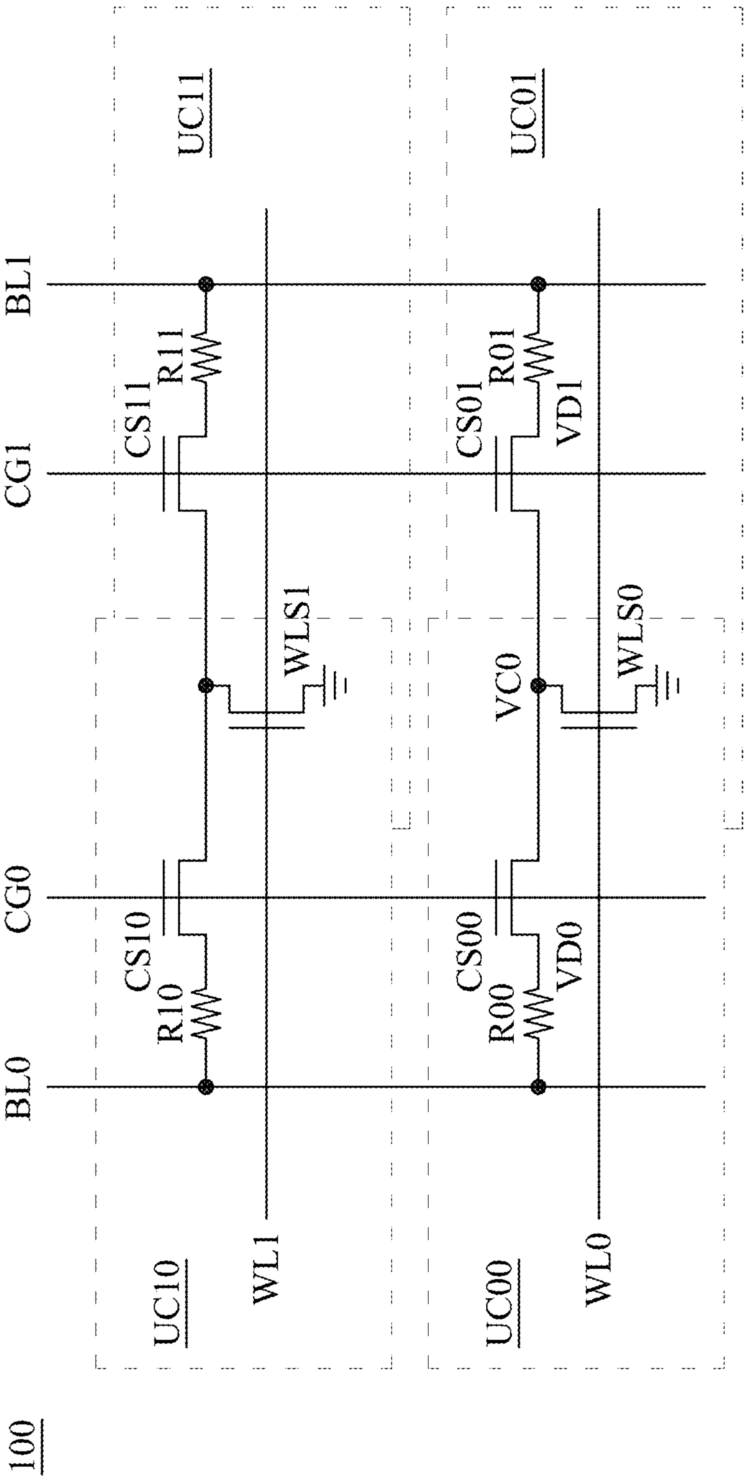
FIG. 1A illustrates a circuit diagram of a memory circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In high-voltage applications such as fuse, anti-fuse, and one-time-programmable (OTP) memories, a stacked-transistor selector is employed, rather than a single-transistor selector, in order to ensure reliability of the devices by reducing the voltage stress on each of the transistors in the stacked selector. However, stacking transistors requires doubling the size of each transistor in order to maintain the same driving capability. Thus, without further improvement, a stacked-transistor selector may occupy approximately four times the area of a single-transistor selector. In addition, a larger memory cell size may increase voltage drop across the memory cell interconnect due to the parasitic resistance of the interconnect and the longer distance that current travels during read and write operation.

The present disclosure provides various embodiments of a memory circuit, method, and device in which two or more memory cells share a portion of the stacked-transistor selector. Namely, in various embodiments the cascode transistors of two or more stacked-transistor selectors share a common source transistor. Advantageously, embodiments of the disclosed memory circuit, method, and device can achieve several benefits. In some embodiments, by sharing the portion of the stacked-transistor selector, the embodiments of the disclosed memory circuit, method, and device reduce the area of a memory cell (e.g., by 25% or any of other various percentages) In some embodiments, by sharing the portion of the stacked-transistor selector, the embodiments of the disclosed memory circuit, method, and device enlarge driving capability of the stacked-transistor selector without increasing memory cell area or degrading reliability. In some embodiments, by sharing the portion of the stacked-transistor selector, the embodiments of the disclosed memory circuit, method, and device reduce the parasitic voltage drop without degrading driving capability or reliability.

FIG. 1A illustrates a circuit diagram of memory circuit 100, in accordance with some embodiments of the present disclosure. The memory circuit 100 may also be referred to as a memory array. The memory circuit 100 includes a number of memory cells, for example, UC00, UC01, UC10, and UC11. Memory cells may also be referred to as unit cells. The memory cells can be arranged in a row-column configuration in which each column has a bit line (BL) and a cascode gate line (CGL) and each row has a word line (WL). The BL and the CGL of each column are respectively coupled to a number of memory cells that are disposed in that column, and each memory cell in that column is arranged on a different row and coupled to a respective (different) WL. In the same regard, the WL of each row is respectively coupled to a number of memory cells that are disposed in that row, and each memory cell in that row is arranged on a different column and coupled to a respective (different) BL and CGL.

Referring still to FIG. 1A, and in greater detail, four memory cells, UC00, UC01, UC10, and UC11, are shown in memory circuit 100 for illustration purposes. The memory cells UC00 and UC10 are arranged along a first column and coupled to BL0 and CG0; and the memory cells UC01 and UC11 are arranged along a second column and coupled to BL1 and CG1; the memory cells UC00 and UC01 are arranged along a first row and coupled to WL0; and the memory cells UC10 and UC11 are arranged along a second row and coupled to WL1. Even though FIG. 1A illustrates the memory circuit 100 as a two-by-two array of memory cells, the memory circuit 100 can include any number of rows (and corresponding WLs) and any number of columns (and corresponding BLs) while remaining in the scope of the disclosure.

As shown in FIG. 1A, each memory cell includes a storage element, a first transistor coupled to the storage element, and a second transistor coupled to the first transistor. For example, the memory cell UC00 includes a resistor R00 as the storage element, a transistor CS00 as the first transistor coupled to the resistor R00, and a transistor WLS0 as the second transistor coupled to transistor CS00. Specifically, in some embodiments, one end of R00 is coupled to a drain of CS00, and a source of CS00 is coupled to a drain of WLS0. A node between the storage element and the first transistor may be referred to as VD. For example, the node between the resistor R00 and the transistor CS00 is VD0.

In each memory cell, the respective BL is coupled to the storage element, the respective CGL is coupled to the first transistor, and the respective WL is coupled to the second transistor. For example, in the memory cell UC00, BL0 is coupled to R00, CG0 is coupled to CS00, and WL0 is coupled to WLS0. Specifically, in some embodiments, BL0 is coupled to a second end of R00, CG0 is coupled to a gate of CS00, and WL0 is coupled to a gate of WLS0.

The two or more of the memory cells have separate first transistors and storage elements. For example, the memory cell UC01 includes resistor R01 as its storage element and transistor CS01 as its first transistor.

Two or more of the memory cells share a second transistor. For example, memory cells UC00 and UC01 share transistor WLS0 as their respective second transistor. The shared second transistor is coupled at a same node (VC) to the first transistor of the two or more memory cells. For example, transistor WLS0 is coupled, at node VC0, to transistor CS00 of memory cell UC00 and transistor CS01 of memory cell UC01. Specifically, in some embodiments, a drain of transistor WLS0 is coupled to a source of transistor CS00 of memory cell UC00 and a source of transistor CS01 of memory cell UC01.

As shown in FIG. 1A, the memory element is a resistor. In some embodiments, a resistor is used as the memory element when programming the memory element includes providing a current to breakdown the memory element. In some embodiments, the memory element may be a memristor, a capacitor, an inductor, or any of other various memory element types or suitable elements for eFuse while remaining within the scope of the present disclosure. In some embodiments, a capacitor is used as the memory element when programming the memory element includes providing a voltage to breakdown the memory element.

As shown in FIG. 1A, each of the first transistor (e.g., CS00) and second transistor (e.g., WLS0) is an n-type metal-oxide-semiconductor (NMOS) transistor. In some embodiments, an advantage of using NMOS transistors for the first and second transistors is that the read and write operations are faster because an NMOS device is faster than a PMOS device. Specifically, in some embodiments, the mobility of electrons, which are carriers in the case of an NMOS transistor, is about two times greater than that of holes, which are the carriers of the PMOS transistor.

The first and second transistors can be any of other various transistor types while remaining within the scope of the present disclosure. The first and second transistors can have a MOS device type of standard threshold voltage (SVT), low threshold voltage (LVT), high threshold voltage (HVT), high voltage (HV), input/output (IO), or any of various other MOS device types. Each first transistor can be referred to as a cascode transistor, and each second transistor can be referred to as a common source transistor. The first and the second transistor can be collectively referred to as a selector, a stacked selector, or stacked select transistors.

Transistor WLS0 is coupled to a first reference node. For example, as shown in FIG. 1A, transistor WLS0 is coupled to ground. Specifically, in some embodiments, the source of transistor WLS0 is coupled to ground. Transistor WLS0 can be coupled to any of other various reference nodes while remaining within the scope of the present disclosure.

In some embodiments, a write operation is performed on a memory cell (e.g., UC10) receiving a BL signal of a first magnitude through its respective BL, a CGL signal of a second magnitude through its respective CGL, and a WL signal of a third magnitude through its respective WL line. The first magnitude may be 1.8V, the second magnitude may be 0.9V, and the third magnitude may be 0.9V, although each of the BL, CGL, and WL signals can have any of various magnitudes while remaining in the scope of the present disclosure. As a result of a write operation, a state (e.g., resistance) of the storage element (e.g., R00) is changed. The write operation may be referred to as a program operation.

In some embodiments, a read operation is performed on a memory cell receiving a BL signal of a fourth magnitude through its respective BL, a CGL signal of a fifth magnitude through its respective CGL, and a WL signal of a sixth magnitude through its respective WL line. The fourth magnitude may be 0.4V, the fifth magnitude may be 0.75V, and the sixth magnitude may be 0.75V, although each of the BL, CGL, and WL signals can have any of various magnitudes while remaining in the scope of the present disclosure.

Table 1 illustrates example bias conditions. Each bias condition includes corresponding signal magnitudes for WL, BL, CGL, VD, and VC when a memory cell is being written to, read from, or neither (e.g., standby). In the cases where only WL or only BL is selected, it means that a second memory cell in the same row or column, respectively, is being written to or read from. When the second memory cell is in the same row, it is assumed that the memory cell and the second memory cell are sharing a same WLS transistor. The term "~X" means that the value is X or substantially near X, where X is a number.

TABLE 1

| | Write bias conditions | | | Read bias conditions | | | Standby |
|---|---|---|---|---|---|---|---|
| | WL, BL selected | Only WL selected | Only BL selected | WL, BL selected | Only WL selected | Only BL selected | Neither WL or BL selected |
| WL | 0.9 V | 0.9 V | 0 | 0.75 V | 0.75 V | 0 | 0 V |
| BL | 1.8 V | 0 V | 1.8 V | <0.5 V | 0 V | <0.5 V | 0 V |
| NG | 0.9 V | 0 V | 0.9 V | 0.75 V | 0 V | 0.75 V | 0 V |
| VD | ~0 V | 0 V | 1.8 V | ~0 V | 0 V | <0.5 V | 0 V |
| VC | ~0 V | ~0 V | 0.9 V | ~0 V | ~0 V | <0.5 V | 0 V |

Figure 1B:
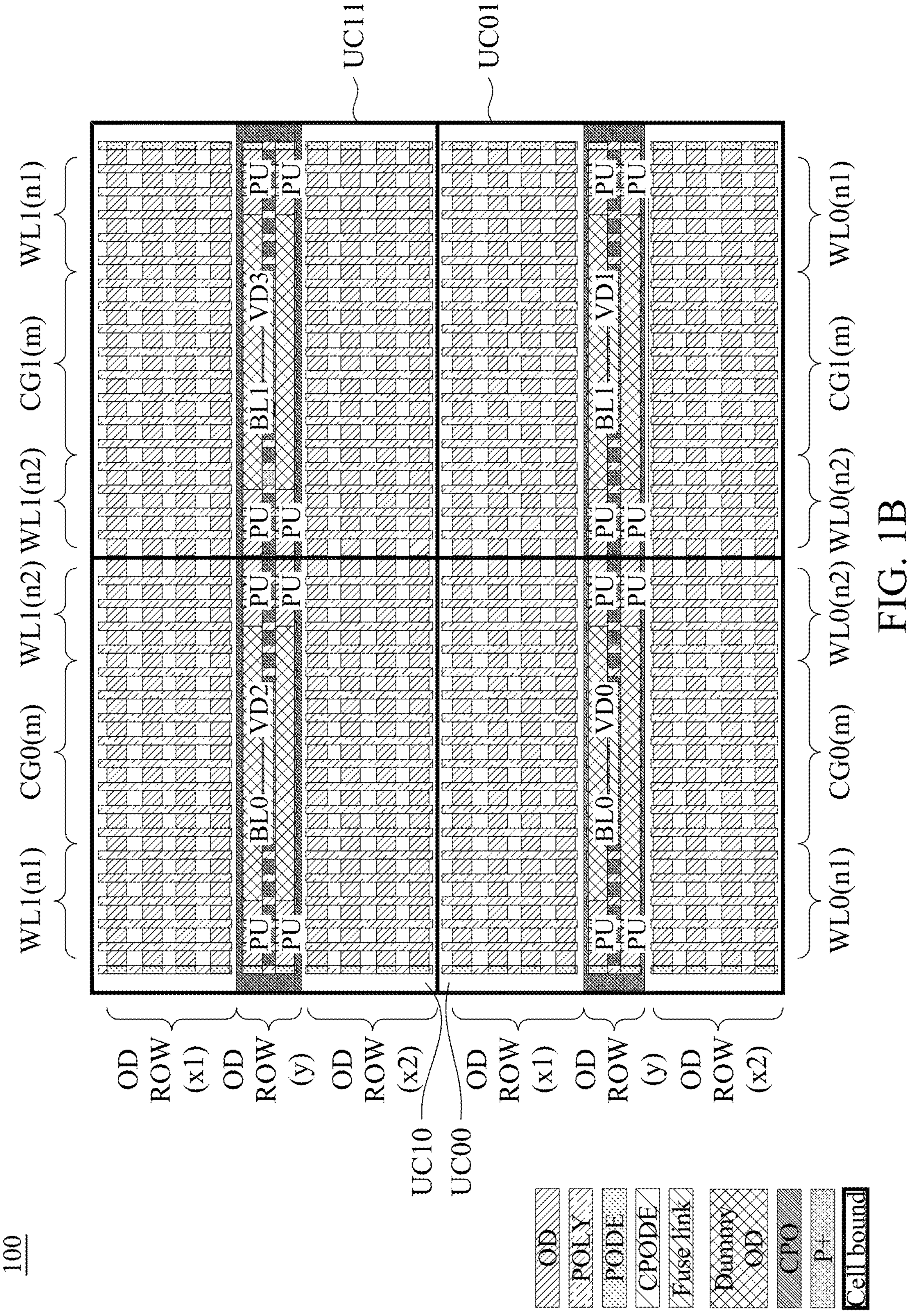
FIG. 1B illustrates a circuit layout of a memory circuit, in accordance with various embodiments.

FIG. 1B illustrates a circuit layout of memory circuit 100, in accordance with various embodiments. Each of the memory cells of the memory circuit 100 includes a number of active (OD) structures extending in a first lateral direction and spaced from each other along a second lateral direction perpendicular to the first lateral direction. For example, UC00 includes a number of OD structures. In some embodiments, the OD structure is a semiconductor material that is doped (e.g., with a p-type or an n-type dopant). In some embodiments, the OD structure is disposed over a semiconductor substrate. In some embodiments, a well (e.g., n-well or p-well) structure is disposed over the OD structure. It is understood that when A is disposed over B, it means that A is spaced from B in a vertical direction perpendicular to the first and second lateral directions, although A may still be coupled to B (e.g., the space may include a via extending in a vertical direction, coupling A to B).

Each of the unit cells of the memory circuit 100 includes a number of gate-defined (GDs) structures extending in the second lateral direction and spaced from each other along the first lateral direction. The GD structures are disposed over the OD structures. A number of the GD structures (e.g., n1+n2, wherein n1 and n2 are integers) in each memory cell are coupled to a word line, e.g., WL0, corresponding to the row of the memory cell. These GD structures may be referred to as WL GD structures. The overlap of a WL GD structure over a OD structure is equivalent to one unit of the second transistor such as WLS0. One unit of a transistor can be referred to as a finger.

In some embodiments, a ratio of a number of first transistor units (e.g., fingers) times the width of the first transistor units (e.g., width of the OD structures extending in the second direction) times the gate length of the first transistor units (e.g., width of GD structures extending in the first direction) and a number of second transistor units times the width of the second transistor units times the gate length of the second transistor units is 1, greater than 1, 2, greater than 2, or any of other various numbers. For example, in some embodiments, the widths of the unit transistors are the same, the gate lengths of the unit transistors are the same, and m is equal to n1+n2, 2n1+2n2, or any of other various number of GD structures.

A number of the GD structures (e.g., m, wherein m is an integer) is coupled to a cascode gate line, e.g., CG0, corresponding to the column of the memory cell. These GD structures may be referred to as CGL GD structures. The overlap of a cascode CGL GD structure over a OD structure is equivalent to one unit of the first transistor such as CS00. Each of the GD structures can include Cu, Al, Co, Ru, W, poly-Si, or any of other various conductive materials.

Each of the unit cells of the memory circuit 100 includes a fuse link. The fuse link is a layout embodiment of a storage element of FIG. 1A, such as the resistor R00. The fuse link is coupled on one end to a bit line such as BL0. The fuse link is coupled on the other end to OD of the first transistor such as CS00.

Each of the unit cells of the memory circuit 100 includes a pickup (PU). The pickup may be referred to as a p-well. The pickup provides a point of contact to the substrate. The pickup may be required in order to pass design rule checks.

Figure 1C:
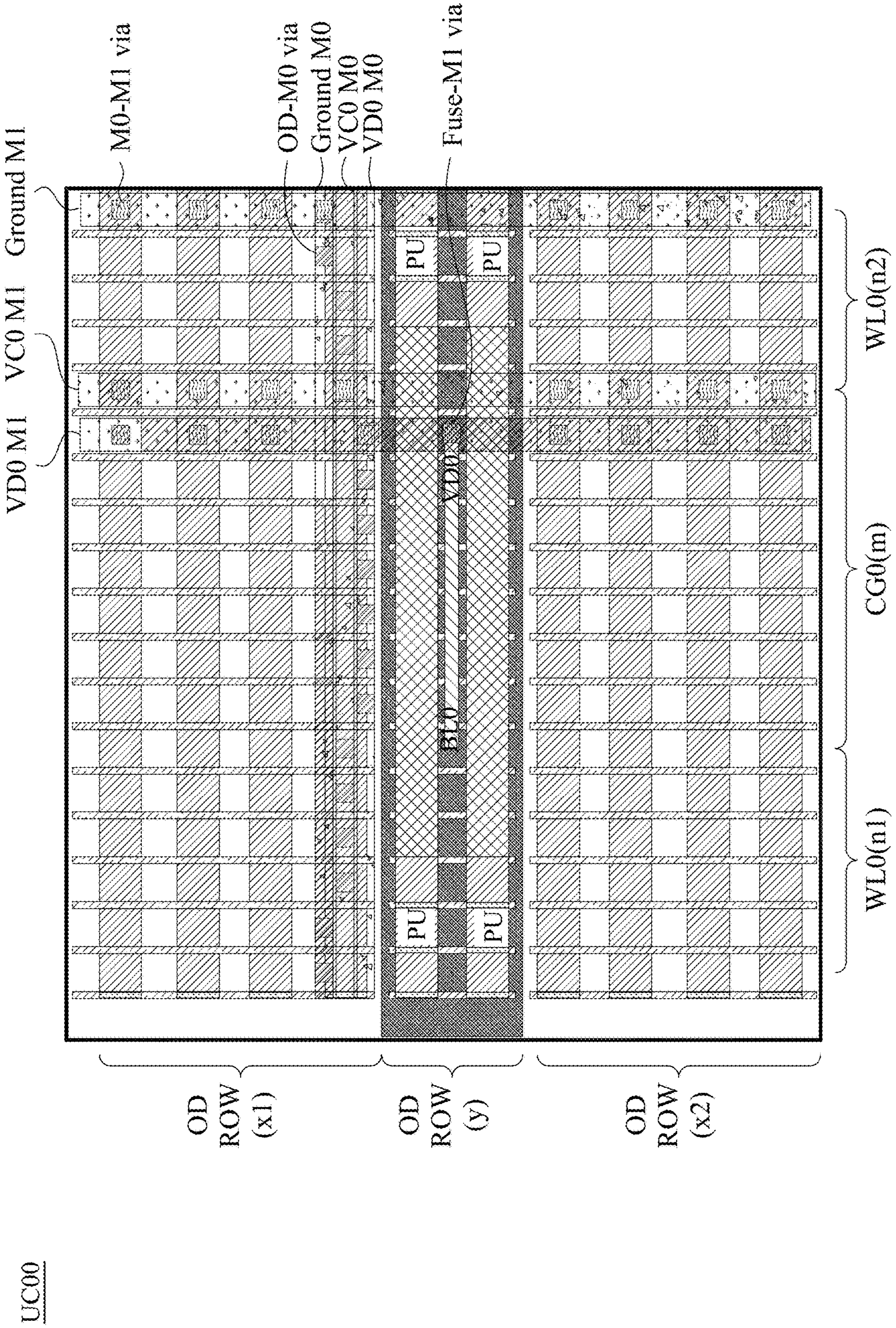
FIG. 1C illustrates a circuit layout of a memory cell, in accordance with various embodiments.

FIG. 1C illustrates a circuit layout of memory cell UC00, in accordance with various embodiments. The purpose of FIG. 1C is to show an example of conductive structures that couple the various transistor units of the memory cell UC00. The memory cell UC00 includes a number of first conductive structures (e.g., M0 structures) in the first lateral direction and spaced from each other along the second lateral direction. Each of the first conductive structures is disposed over a number of OD portions. For example, the conductive structure VD0 M0 is disposed over a first number of OD portions in a first row, the conductive structure VC0 M0 is disposed over a second number of OD portions the first row, and the conductive structure Ground M0 is disposed over a third number of OD portions in the first row. Each OD portion may refer to a segment of an OD structure that is in between two adjacent GD structures. Each OD portion may refer to a segment of an OD structure that is in between two adjacent GD structures or that the adjacent GD structures are disposed over. Each of the number of OD portions can be coupled to the associated conductive structure by a via such as an OD-M0 via.

In some embodiments, the first number of OD portions may define the VD node, the second number of OD portions may define the VC node, and the third number of OD portions may define the first reference node. Although the first conductive structures are extending over the first row, it is understood that additional conductive structures may extend over other rows. In some embodiments, each of the first conductive structures extends to adjacent memory cells (e.g., UC01) and is disposed over OD portions of the adjacent memory cells. Each of the first conductive structures can include Cu, Al, Co, Ru, W, or any of other various conductive materials.

The memory cell UC00 includes a number of second conductive structures (e.g., M1 structures) in the second lateral direction and spaced from each other along the first lateral direction. Each of the second conductive structures is disposed over a number of first metal structures. Additionally, each of the second conductive structures is disposed above a number of OD portions. For example, the conductive structure VD0 M1 is disposed over a fourth number of OD portions in a first column, the conductive structure VC0 M1 is disposed over a fifth number of OD portions a second column, and the conductive structure Ground M1 is disposed over a sixth number of OD portions in a third column. Each of the number of OD portions can be coupled to the associated conductive structure by a combination of vias and conductive structures such as an OD-M0 via, an M0 structure, and an M0-M1 via.

Although the second conductive structures are extending over three columns, it is understood that additional metal structures may extend over other columns. In some embodiments, each of the second conductive structures extends to adjacent memory cells (e.g., UC10) and is disposed over OD portions of the adjacent memory cells. Each of the second conductive structures can include Cu, Al, Co, Ru, W, or any of other various conductive materials.

Figure 1D:
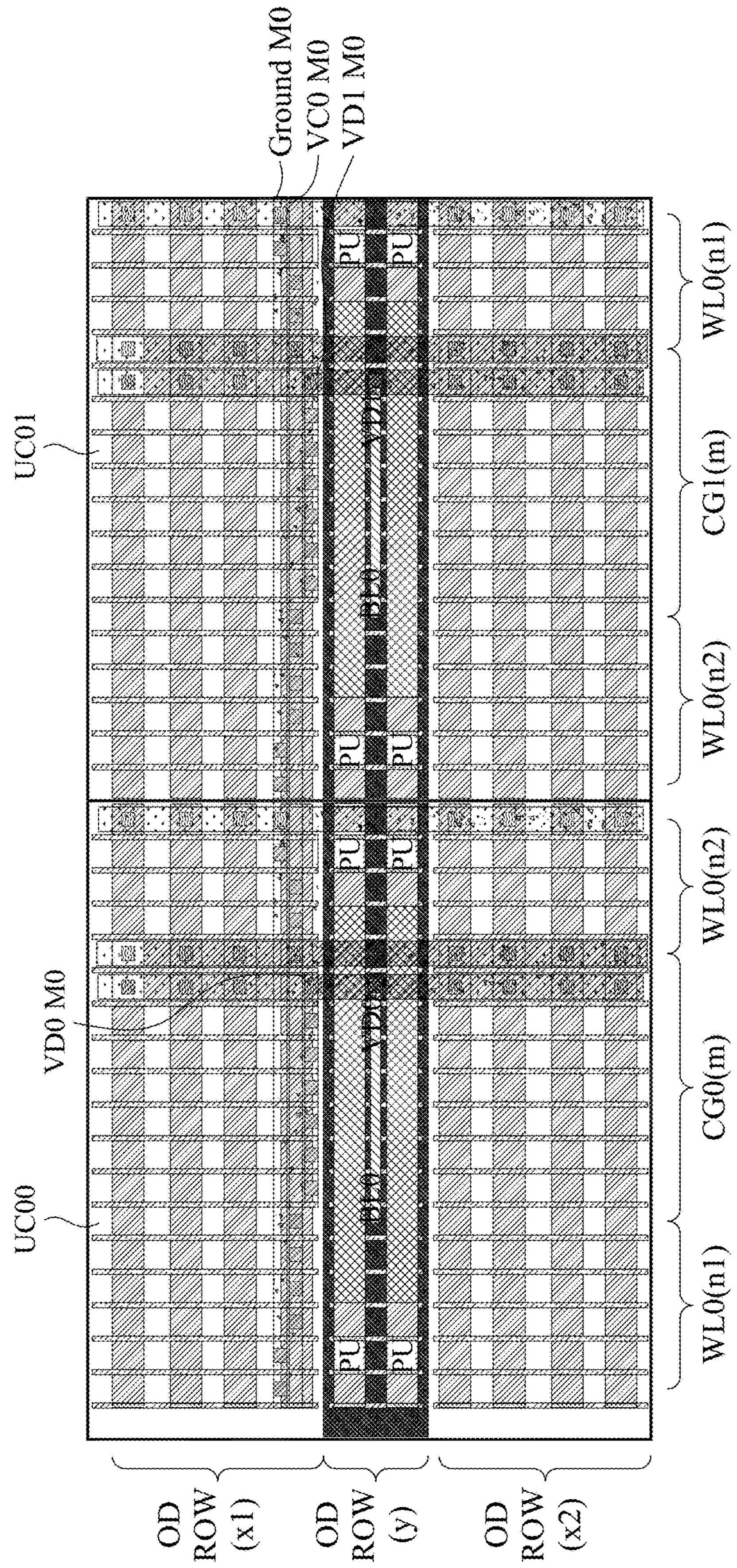
FIG. 1D illustrates a circuit layout of two memory cells, in accordance with various embodiments.

FIG. 1D illustrates a circuit layout of memory cell UC00 and the memory cell UC01, in accordance with various embodiments. FIG. 1D is similar to FIG. 1C except that FIG. 1D illustrates how conductive structures couple various transistor units across multiple memory cells. One application of coupling transistor units across multiple memory cells is when multiple memory cells are sharing a same one or more common source transistor units.

In some embodiments, the VC nodes are shared among multiple memory cells. For example, the conductive structure VC0 M0 is disposed over a second number of OD portions of the first row of UC00 and a second number of OD portions of the first row of UC01. In some embodiments, the ground nodes are shared among multiple memory cells. For example, the conductive structure Ground M0 is disposed over a third number of OD portions in the first row of UC00 and a third number of OD portions in the first row of UC01. In some embodiments, the VD nodes are not shared among multiple memory cells. For example, UC00 has a first VD node and UC01 has a second UC01. In some embodiments, the conductive structure VD0 M0 is disposed over a first number of OD portions in a first row of UC00 and the conductive structure VD1 M0 is disposed over a first number of OD portions in a first row of UC01.

Figure 1E:
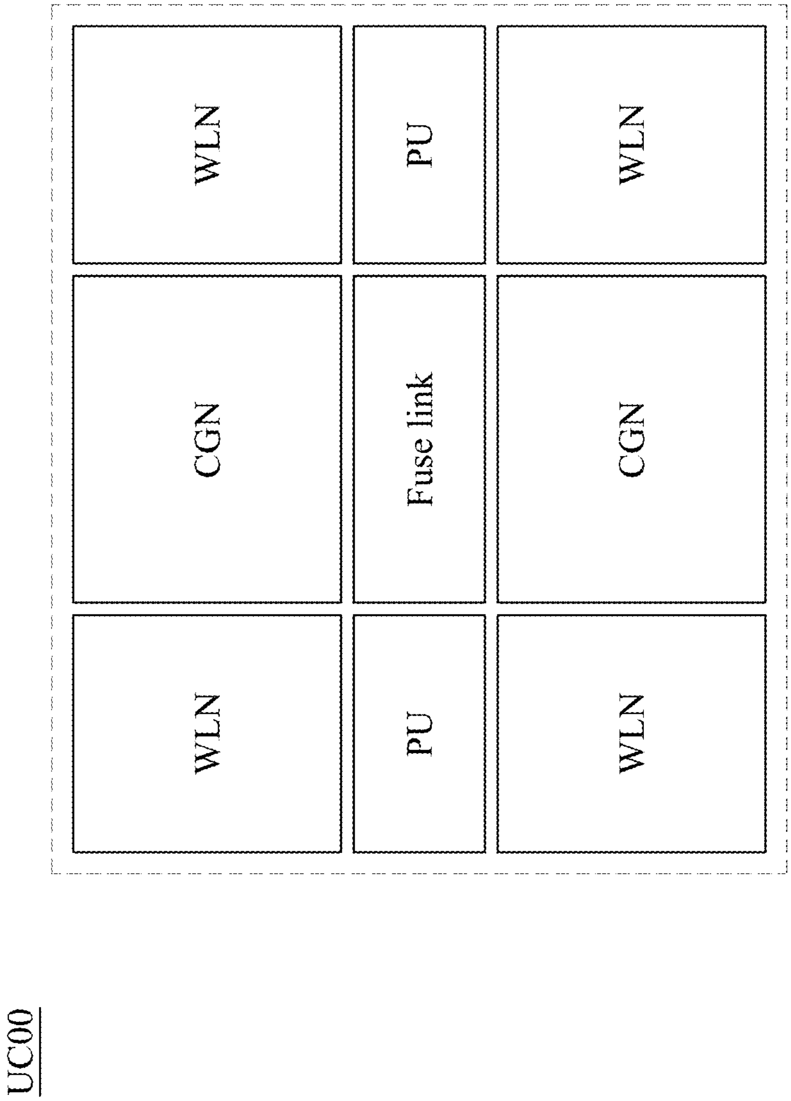
FIG. 1E illustrates a circuit layout of a memory cell, in accordance with various embodiments.

FIG. 1E illustrates a circuit layout of memory cell UC00, in accordance with various embodiments. The purpose of FIG. 1E is to show a high-level layout arrangement. WLN represents a region of the layout including transistor units of the second transistor (e.g., WLS0), CGN represents a region of the layout including transistor units of the first transistor (e.g., CS00), fuse link represents a region of the layout including the storage element (e.g., R00), and PU represents a region of the layout including the connection to the substrate.

In some embodiments, the memory cell UC00 is a 3×3 array of regions. In some embodiments, a first row includes a WLN region, a CGN region, and a WLN region, a second row adjacent to the first row includes a PU region, a fuse link region, and a PU region, and a third row adjacent to the second row includes a WLN region, a CGN region, and a WLN region. In some embodiments, a first column includes a WLN region, a PU region, and a WLN region, a second column adjacent to the first column includes a CGN region, a fuse link region, and a CGN region, and a third column adjacent to the second column includes a WLN region, a PU region, and a WLN region. Even though FIG. 1E illustrates the memory cell UC00 as a 3×3 array of regions, the memory cell UC00 can include any number of regions.

Figure 2A:
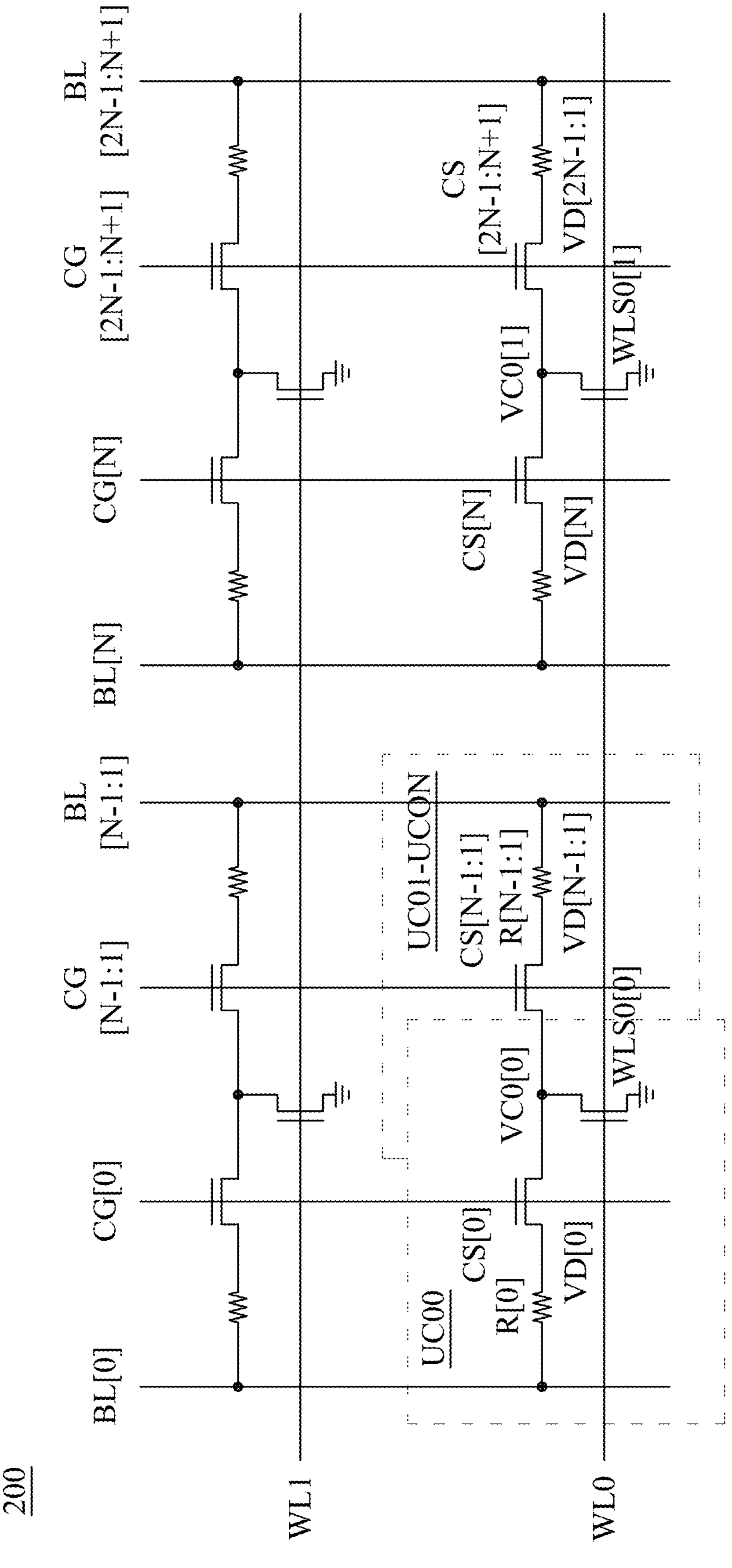
FIG. 2A illustrates a circuit diagram of a memory circuit, in accordance with some embodiments of the present disclosure.

FIG. 2A illustrates a circuit diagram of memory circuit 200, in accordance with some embodiments of the present disclosure. The memory circuit 200 is similar to the memory circuit 100 of FIG. 1A except that the memory circuit 200 is a 2×2N array of memory cells in which each N memory cells share one common source transistor, wherein N is equal to 3 or more. In some embodiments, an advantage of sharing one common source transistor among N memory cells is that, for a given number of memory cells, the memory cell size is smaller than if only 2 memory cells share one common source transistor. Even though FIG. 2A illustrates the memory circuit 100 as a 2×2N array of memory cells, the memory circuit 100 can include any number of rows (and corresponding WLs) and any number of columns (and corresponding BLs) while remaining in the scope of the disclosure. In some embodiments, the common source transistors WLS[N−1:0] of the N memory cells corresponding to the first N columns are not shared with the common source transistors WLS[2N−1:N] of the N memory cells corresponding to the last N columns.

Like in FIG. 1A, each of the memory cells of FIG. 2A includes a corresponding storage element, first transistor, and second transistor. For example, the memory cell UC00 includes the storage element R[0], the first transistor CS[0], and the second transistor WLS0[0], the memory cell UC01 includes the storage element R[1], the first transistor CS[1], and the second transistor WLS0[0], etc.

Figure 2B:
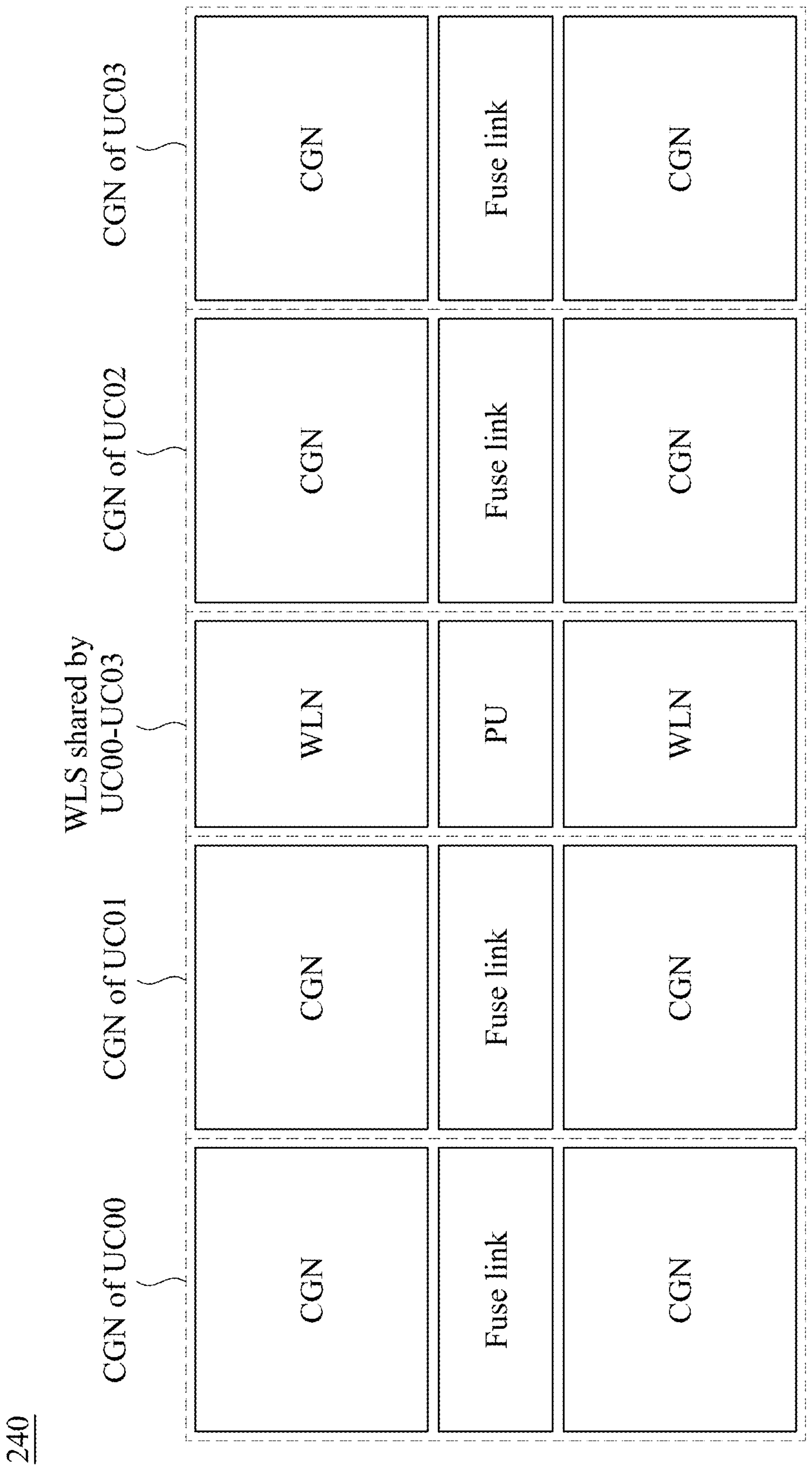
FIG. 2B illustrates a circuit layout of memory cells, in accordance with various embodiments.

FIG. 2B illustrates a circuit layout of memory cells 240, in accordance with various embodiments. The memory cells 240 are similar to the memory cell UC00 of FIG. 1E except that each of the memory cells 240 (e.g., UC00, UC01, UC02, and UC03) is sharing the same common source transistor WLS. In some embodiments, a benefit of arranging the memory cells 240 as shown in FIG. 2A is that the routing between the common source transistor and the memory cells is easier to implement because all of the common source transistors are located in a same column. In some embodiments, UC00, UC01, UC02, and UC03 are memory cells of the first N columns.

In some embodiments, the memory cell 240 is a 3×5 array of regions. In some embodiments, a first row includes a CGN of UC00 region, a CGN of UC01 region, and a shared WLN region, a CGN of UC02 region, and a CGN of UC03 region; a second row adjacent to the first row includes a fuse link of UC00 region, a fuse link of UC01 region, a PU region, a fuse link of UC02 region, and a fuse link of UC03 region; and a third row adjacent to the second row includes a CGN of UC00 region, a CGN of UC01 region, and a shared WLN region, a CGN of UC02 region, and a CGN of UC03 region.

In some embodiments, a first column includes a CGN of UC00 region, a fuse link of UC00 region, and a CGN of UC00 region; a second column adjacent to the first column includes a CGN of UC01 region, a fuse link of UC01 region, and a CGN of UC01 region; a third column adjacent to the second column includes a WLN region, a PU region, and a WLN region; a fourth column adjacent to the third column includes a CGN of UC02 region, a fuse link of UC02 region, and a CGN of UC02 region; and a fifth column adjacent to the fourth column includes a CGN of UC03 region, a fuse link of UC03 region, and a CGN of UC03 region. Even though FIG. 2B illustrates the memory cell 240 as a 3×5 array of regions, the memory cell 240 can include any number of regions.

Figure 3A:
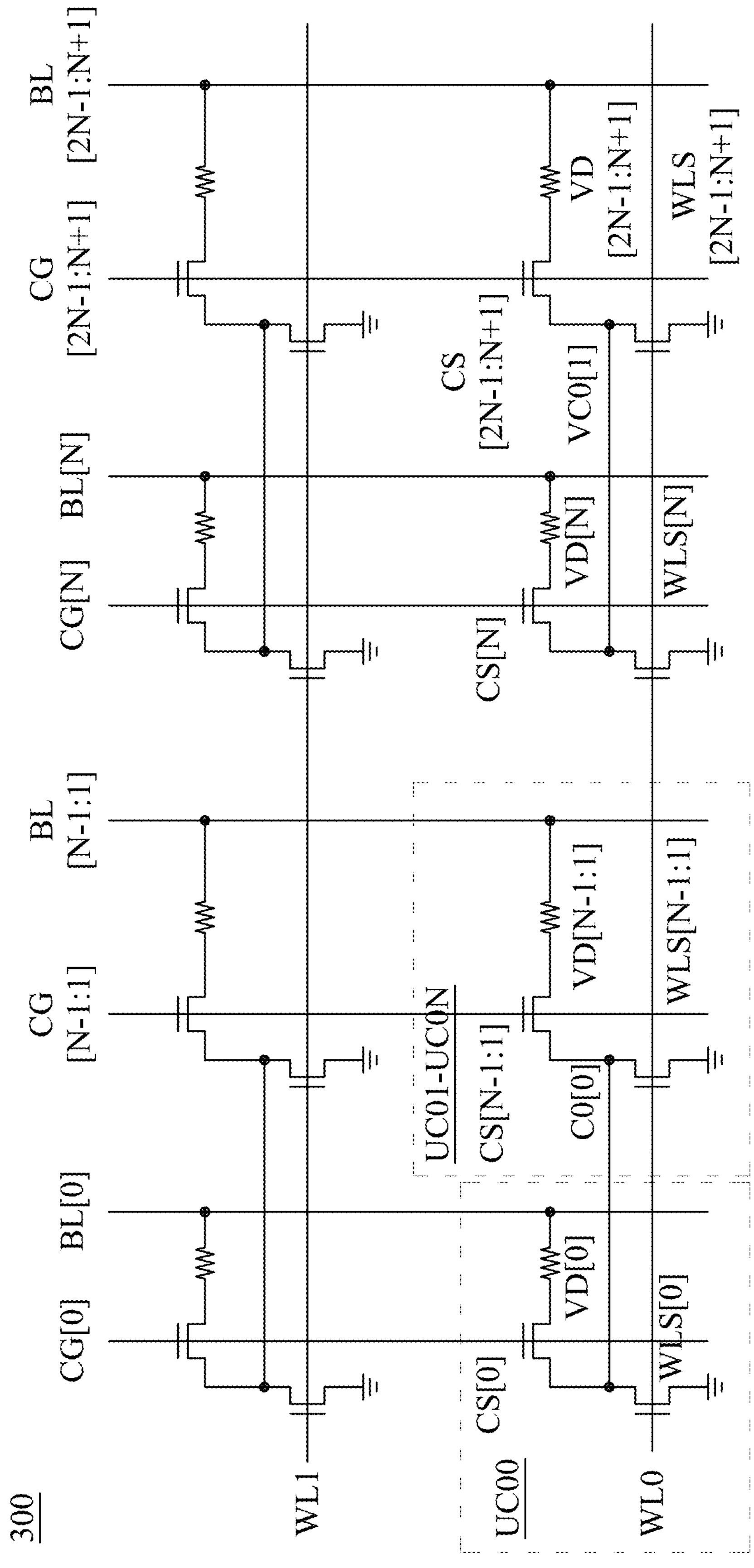
FIG. 3A illustrates a circuit diagram of a memory circuit, in accordance with some embodiments of the present disclosure.

FIG. 3A illustrates a circuit diagram of memory circuit 300, in accordance with some embodiments of the present disclosure. The memory circuit 300 is similar to the memory circuit 200 of FIG. 2A except that the common source transistors are distributed. In some embodiments, an advantage of distributing the common source transistors WLS[N−1:0] is that distance between each memory cell's cascode transistor and the nearest common source transistor is reduced. This can result in a reduction in the parasitic resistance between the cascode transistor and the common source transistor.

Figure 3B:
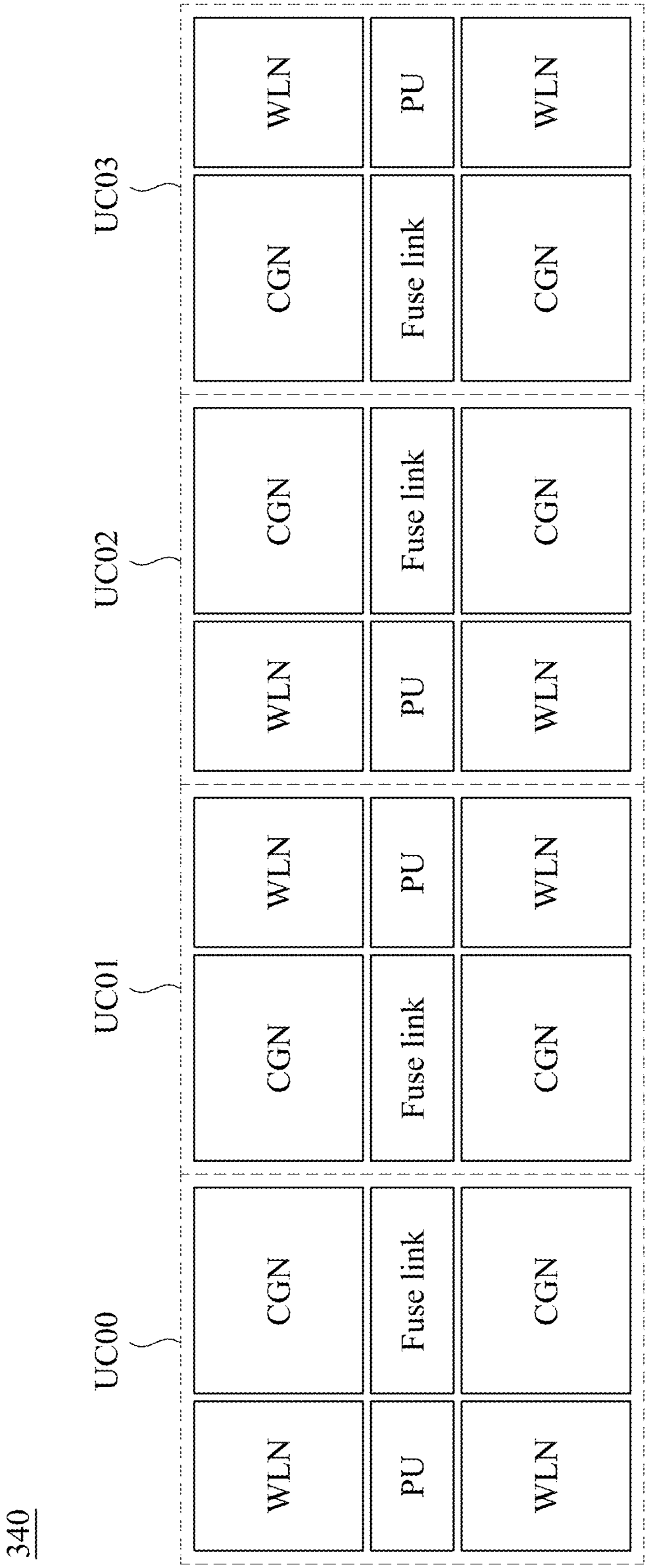
FIG. 3B illustrates a circuit layout of memory cells, in accordance with various embodiments.

FIG. 3B illustrates a circuit layout of memory cells 340, in accordance with various embodiments. The memory cells 340 are similar to the memory cell 240 of FIG. 2B except that the common source transistors of the memory cells 340 are distributed. In some embodiments, an advantage of distributing the common source transistors is that distance between each memory cell's cascode transistor and the nearest common source transistor is reduced and the parasitic resistance due to the routing is reduced.

In some embodiments, the memory cell 340 is a 3×8 array of regions. In some embodiments, a first row includes a first portion of a distributed shared WLN region, a CGN of UC00 region, a CGN of UC01 region, a second portion of a distributed shared WLN region, a third portion of a distributed shared WLN region, a CGN of UC02 region, a CGN of UC03 region, and a fourth portion of a distributed shared WLN region; a second row adjacent to the first row includes a PU region, a fuse link of UC00 region, a fuse link of UC01 region, a PU region, a PU region, a fuse link of UC02 region, a fuse link of UC03 region, and a PU region; and a third row adjacent to the second row includes the same as the first row.

In some embodiments, a first column includes a first portion of a shared WLN region, a PU region, and a first portion of a shared WLN region; a second column adjacent to the first column includes a CGN of UC00 region, a fuse link of UC00 region, and a CGN of UC00 region; a third column adjacent to the second column includes a CGN of UC01 region, a fuse link of UC01 region, and a CGN of UC01 region; a fourth column adjacent to the third column includes a second portion of a shared WLN region, a PU region, and a second portion of a shared WLN region; a fifth column adjacent to the fourth column includes a third portion of a shared WLN region, a PU region, and a third portion of a shared WLN region; a sixth column adjacent to the fifth column includes a CGN of UC02 region, a fuse link of UC02 region, and a CGN of UC02 region; a seventh column adjacent to the sixth column includes a CGN of UC03 region, a fuse link of UC03 region, and a CGN of UC03 region; and an eighth column adjacent to the seventh column includes a fourth portion of a shared WLN region, a PU region, and a fourth portion of a shared WLN region. Even though FIG. 3B illustrates the memory cell 340 as a 3×8 array of regions, the memory cell 340 can include any number of regions.

Figure 4:
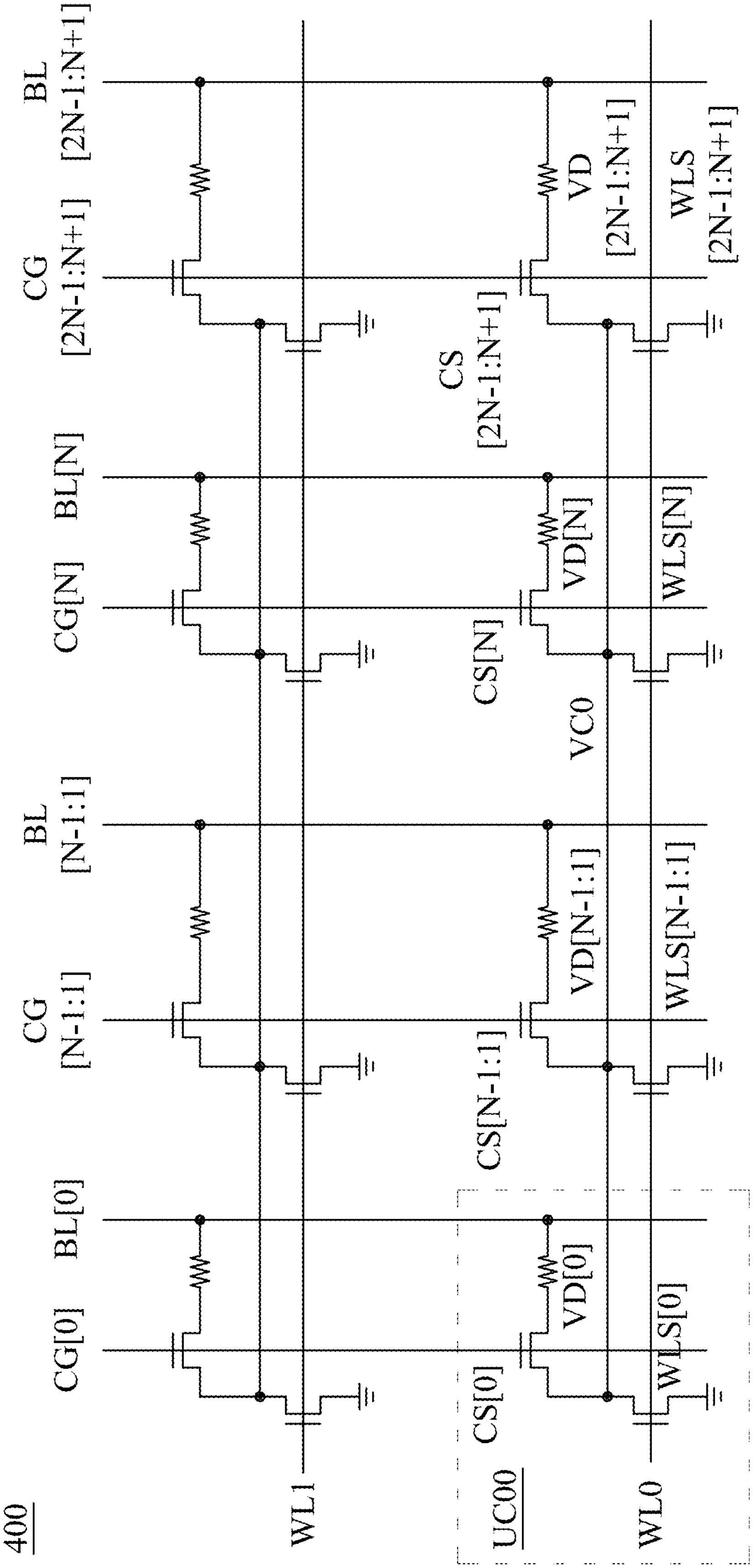
FIG. 4 illustrates a circuit diagram of a memory circuit, in accordance with some embodiments of the present disclosure.

FIG. 4 illustrates a circuit diagram of memory circuit 400, in accordance with some embodiments of the present disclosure. The memory circuit 400 is similar to the memory circuit 300 of FIG. 3A except that the common source transistors WLS[N−1:0] of the N memory cells corresponding to the first N columns are coupled to the common source transistors WLS[2N−1:N] of the N memory cells corresponding to the last N columns. Thus, each of the 2N cells share the 2N common source transistors. In some embodiments, a benefit of sharing the 2N common source transistors among the 2N memory cells is that the distance between each memory cell's cascode transistor and the average common source transistor is reduced. This can result in a reduction in the parasitic resistance between the cascode transistor and the common source transistor.

Figure 5A:
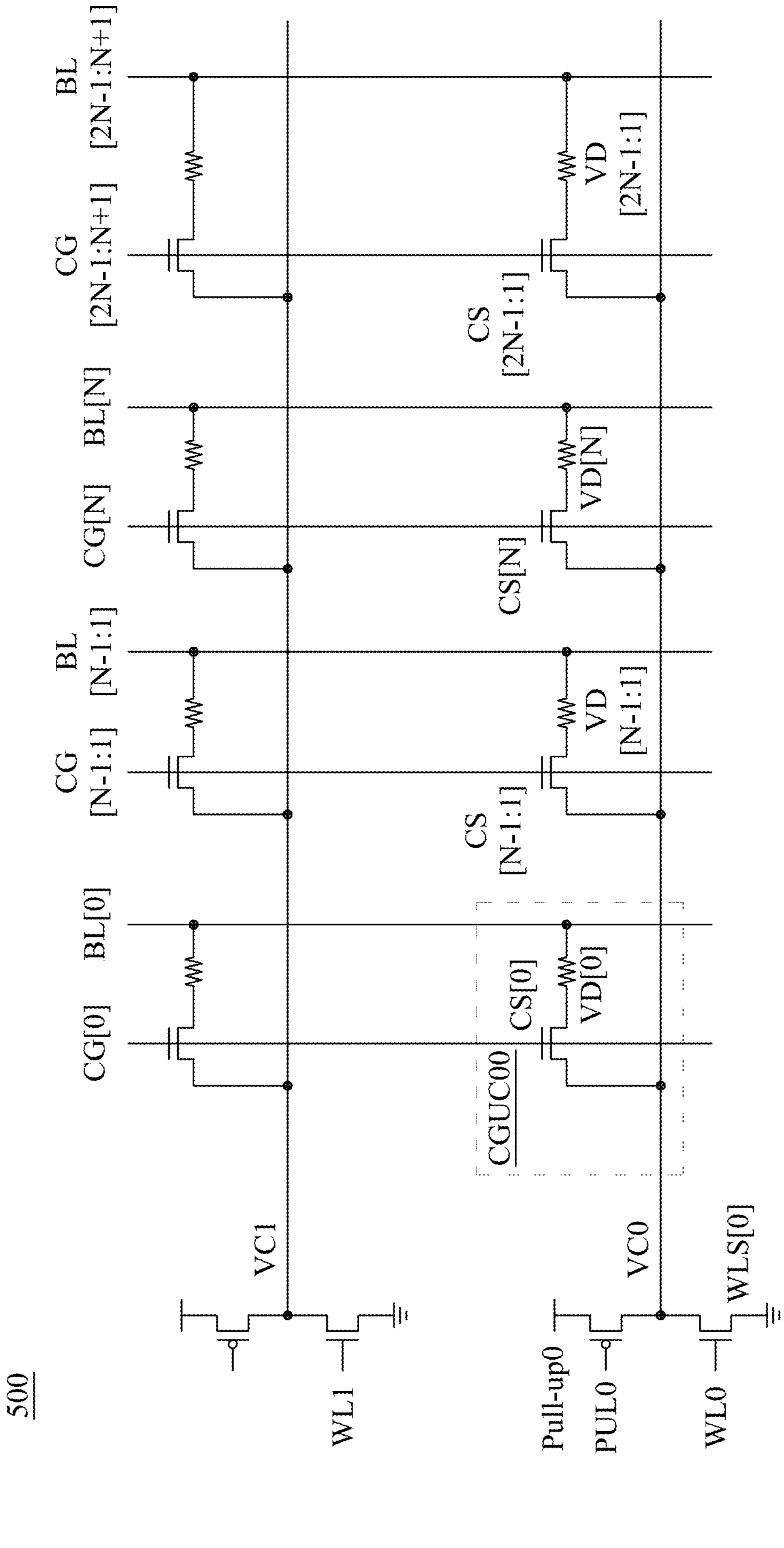
FIG. 5A illustrates a circuit diagram of a memory circuit, in accordance with some embodiments of the present disclosure.

FIG. 5A illustrates a circuit diagram of memory circuit 500, in accordance with some embodiments of the present disclosure. The memory circuit 500 is similar to the memory circuit 400 of FIG. 4 except that there is one common source transistor WLS[0] and it is outside of the array of memory cells. In some embodiments, an advantage of moving the common source transistor WLS[0] outside of the array of memory cells is that the routing between the common source transistor and the memory cells is easier to implement.

In some embodiments, the common source transistor WLS[0] is coupled to a pull-up transistor pull-up0. Specifically, in some embodiments, the drain node of the common source transistor WLS[0] is coupled to the drain node of the pull-up transistor pull-up0. In some embodiments, the common source transistor is an NMOS transistor and the pull-up transistor pull-up0 is a PMOS transistor. In some embodiments, the pull-up transistor pull-up0 is coupled to a pull-up line PUL0. In some embodiments, the pull-up transistor pull-up0 receives a pull-up signal through its pull-up line PUL0.

Figure 5B:
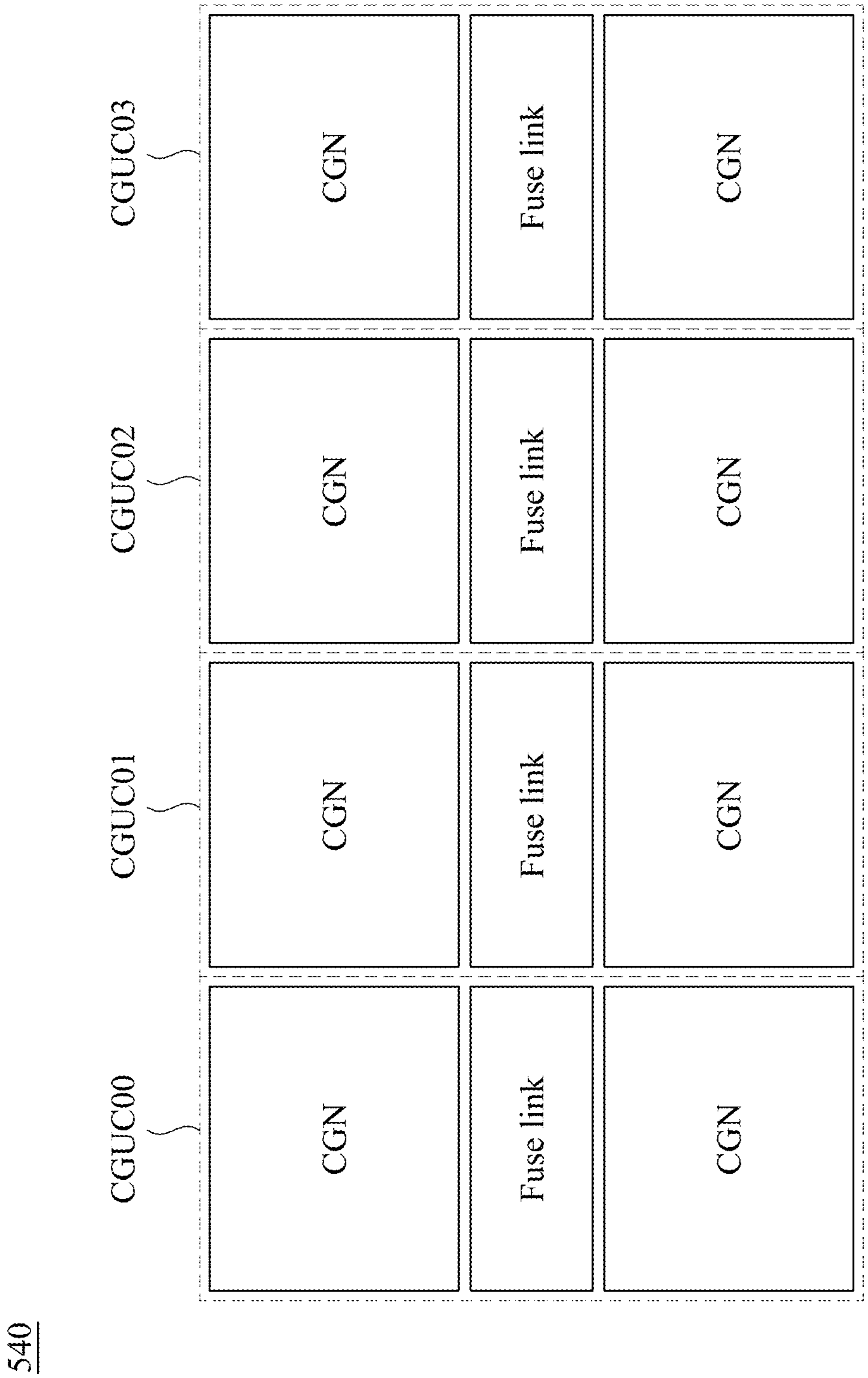
FIG. 5B illustrates a circuit layout of memory cells, in accordance with various embodiments.

FIG. 5B illustrates a circuit layout of memory cells 540, in accordance with various embodiments. The memory cells 540 are similar to the memory cells 240 of FIG. 2B except that the common source transistor separated from the memory cells 540. In some embodiments, an advantage of separating the common source transistor from the array of memory cells is that the routing between the common source transistor and the memory cells is easier to implement.

In some embodiments, the memory cell 540 is a 3×4 array of regions. In some embodiments, a first row includes a CGN of UC00 region, a CGN of UC01 region, a CGN of UC02 region, and a CGN of UC03 region; a second row adjacent to the first row includes a fuse link of UC00 region, a fuse link of UC01 region, a fuse link of UC02 region, and a fuse link of UC03 region; and a third row adjacent to the second row includes the same as the first row.

In some embodiments, a first column includes a CGN of UC00 region, a fuse link of UC00 region, and a CGN of UC00 region; a second column adjacent to the first column includes a CGN of UC01 region, a fuse link of UC01 region, and a CGN of UC01 region; a third column adjacent to the second column includes a CGN of UC02 region, a fuse link of UC02 region, and a CGN of UC02 region; a fourth column adjacent to the third column includes a CGN of UC03 region, a fuse link of UC03 region, and a CGN of UC03 region. Even though FIG. 5B illustrates the memory cells 540 as a 3×4 array of regions, the memory cells 540 can include any number of regions.

Figure 6:
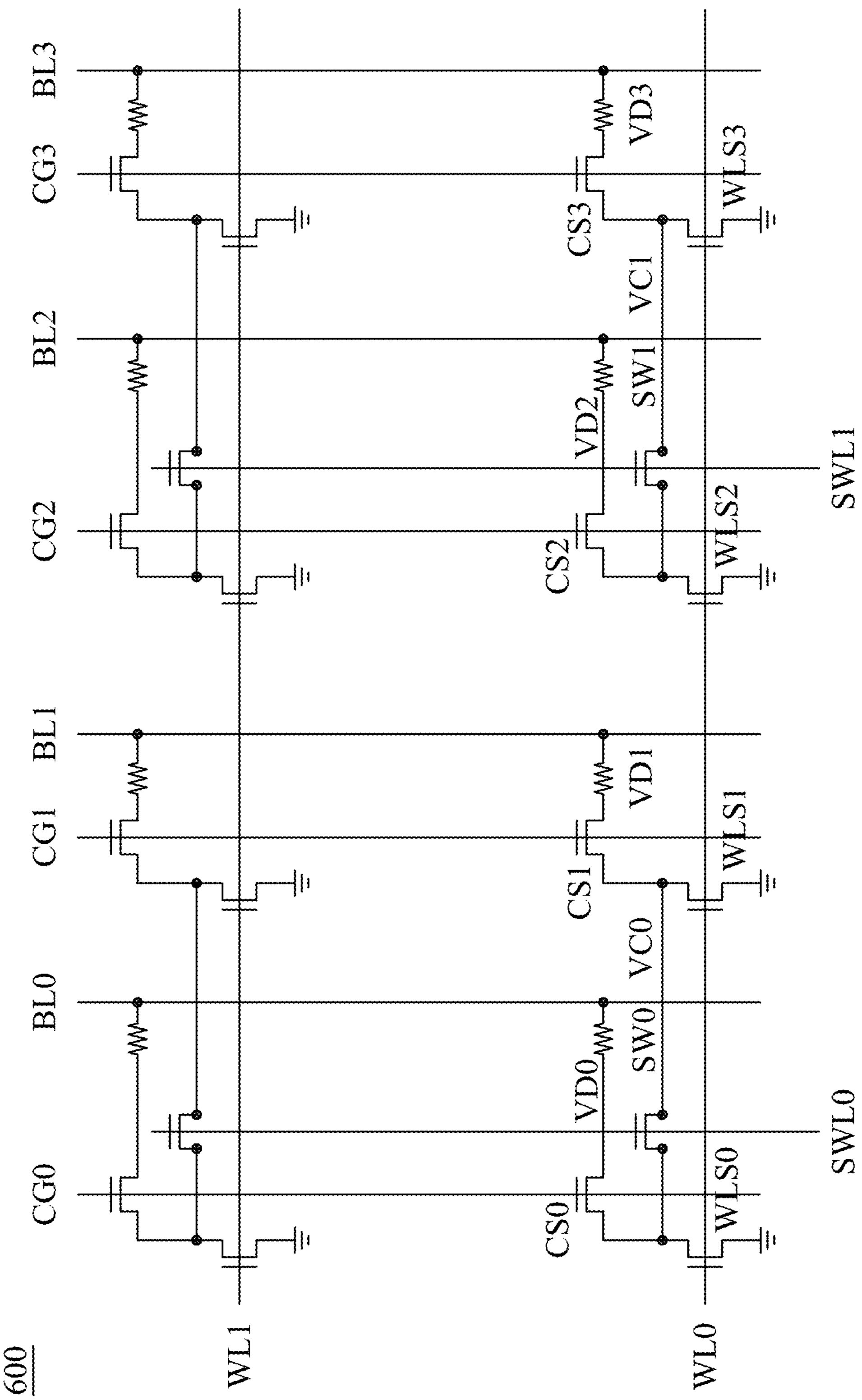
FIG. 6 illustrates a circuit diagram of a memory circuit, in accordance with some embodiments of the present disclosure.

FIG. 6 illustrates a circuit diagram of memory circuit 600, in accordance with some embodiments of the present disclosure. The memory circuit 600 is similar to the memory circuit 300 of FIG. 3A except that the memory cells 600 include a switch SW0 can be configured or reconfigured to either share common source transistors WLS0 and WLS1 or to isolate common source transistors WLS0 and WLS1. In some embodiments, an advantage of sharing the common source transistors is that the driving capability for each memory cell is higher. In some embodiments, an advantage of isolating the common source transistors is that leakage is reduced. An application of isolating the common source transistors is in a memory cell where the storage element is sensitive enough to changes in the programming signal (e.g., current or voltage) that leakage from sharing common source transistors causes the memory cell to be programmed even though the memory cell is not selected to be programmed. In some embodiments, the switch SW0 is coupled to a switch gate line SWL0.

In some embodiments, the switch SW0 can be enabled by receiving a switch enable signal of a first magnitude through its switch gate line SW0. The first magnitude may be 1.8V although the switch enable signal can have any of various first magnitudes while remaining in the scope of the present disclosure. In some embodiments, the switch SW0 can be disabled by receiving a switch enable signal of a second magnitude through its switch gate line. The second magnitude may be 0V although the switch enable signal can have any of various second magnitudes while remaining in the scope of the present disclosure.

Figure 7:
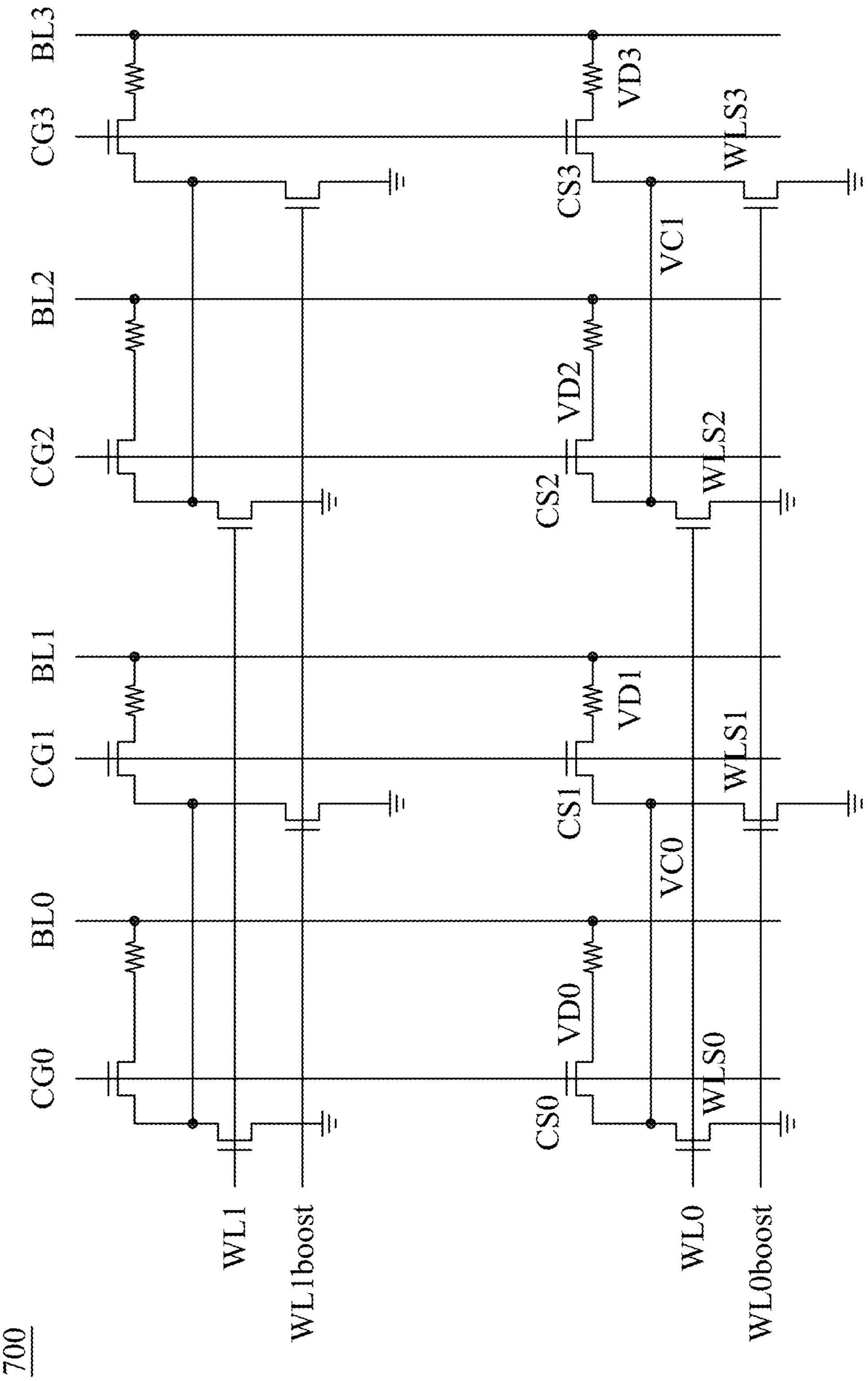
FIG. 7 illustrates a circuit diagram of a memory circuit, in accordance with some embodiments of the present disclosure.

FIG. 7 illustrates a circuit diagram of memory circuit 700, in accordance with some embodiments of the present disclosure. The memory circuit 700 is similar to the memory circuit 300 of FIG. 3A except that configured or reconfigured to either share common source transistors WLS0 and WLS1 or to isolate common source transistors WLS0 and WLS1 because the common source transistor WLS0 is coupled to WL0 and the common source transistor WLS1 is coupled to a word boost line WL0boost. In some embodiments, a benefit of sharing the common source transistors is that the driving capability for each memory cell is higher. In some embodiments, a benefit of isolating the common source transistors is that leakage is reduced. In some embodiments, a benefit of the memory circuit 700 as compared to the memory circuit 600 is that the memory cell area size of the memory circuit 700 is smaller than that of the memory circuit 600 because an additional switch is required for the memory circuit 600.

In some embodiments, the common source transistor WLS0 can be isolated from the common source transistor WLS1 by receiving a word line signal of a first magnitude through its word line and a word line boost signal of a second magnitude through its word boost line. The first magnitude may be 0.9V and the second magnitude may be 0V, although each of the WL and WL boost signals can have any of various magnitudes while remaining in the scope of the present disclosure. In some embodiments, the common source transistor WLS0 can be shared with the common source transistor WLS1 by receiving a word line signal of the first magnitude through its word line and a word line boost signal of a third magnitude through its word boost line. The third magnitude may be 0.9V, although the WL boost signal can have any of various magnitudes while remaining in the scope of the present disclosure.

Figure 8:
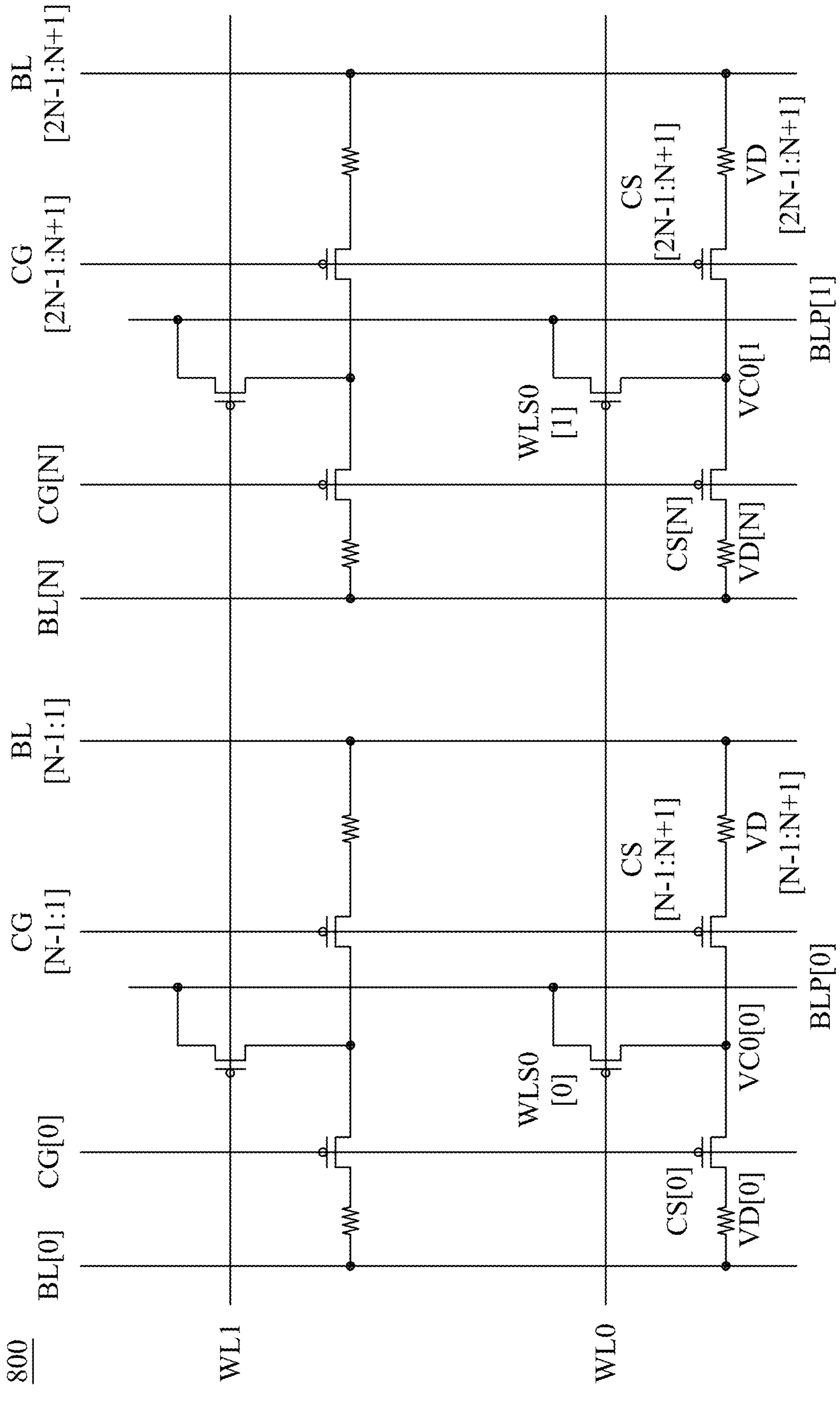
FIGS. 8-13 illustrate circuit diagrams of memory circuits implemented in PMOS, in accordance with some embodiments of the present disclosure.

FIGS. 8-13 illustrate circuit diagrams of memory circuits implemented in PMOS, in accordance with some embodiments of the present disclosure. FIG. 8 illustrates a circuit diagram of the memory circuit 800, which is a PMOS implementation of the memory circuit 200 of FIG. 2A, in accordance with some embodiments of the present disclosure. For example, each of the first transistor CS[0] and the second transistor WLS0[0] is a PMOS transistor. In some embodiments, an advantage of using PMOS transistors for the memory circuit 800 is that PMOS technology is highly controllable, low-cost process with good yield and high noise immunity.

Figure 9:
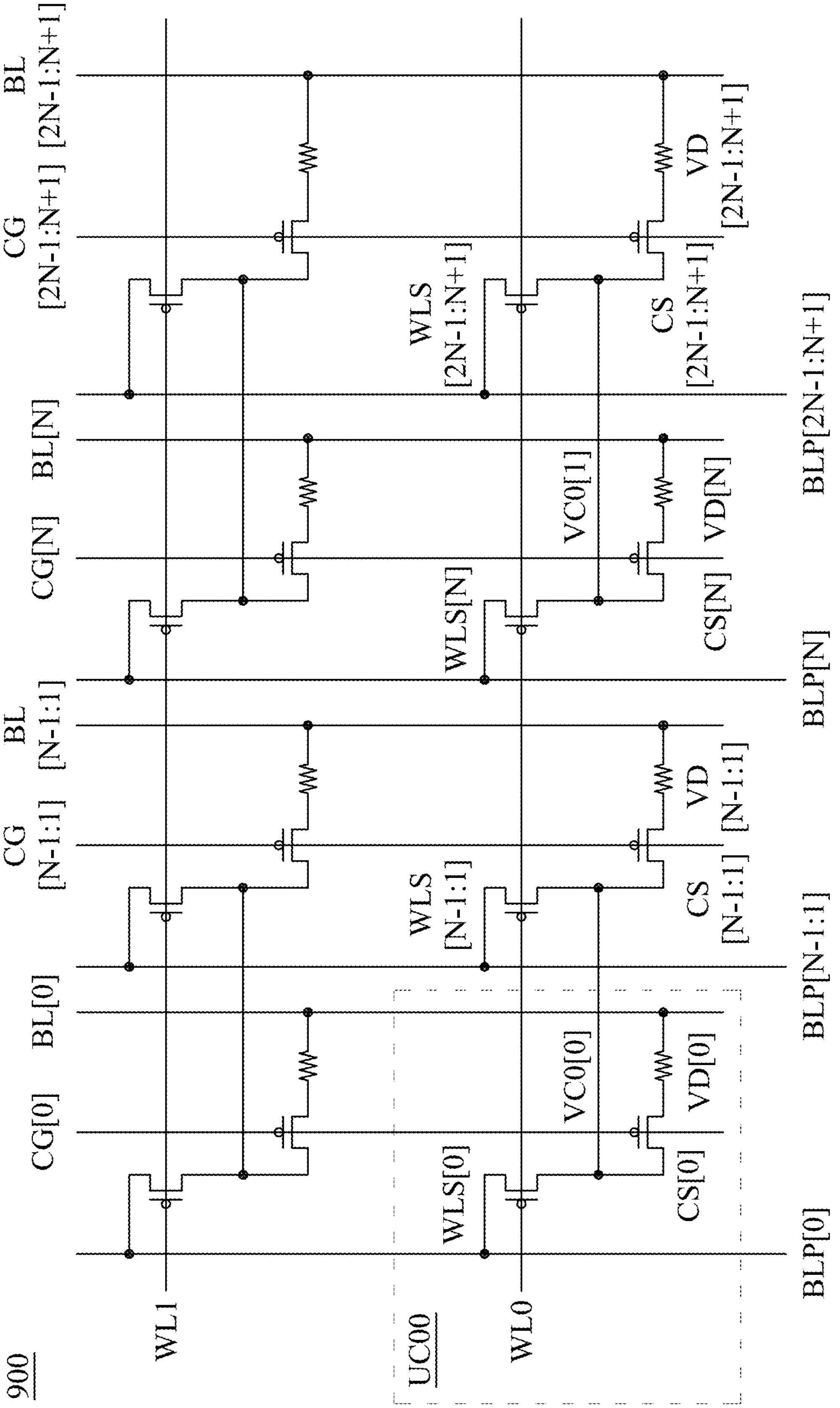
Figure 10:
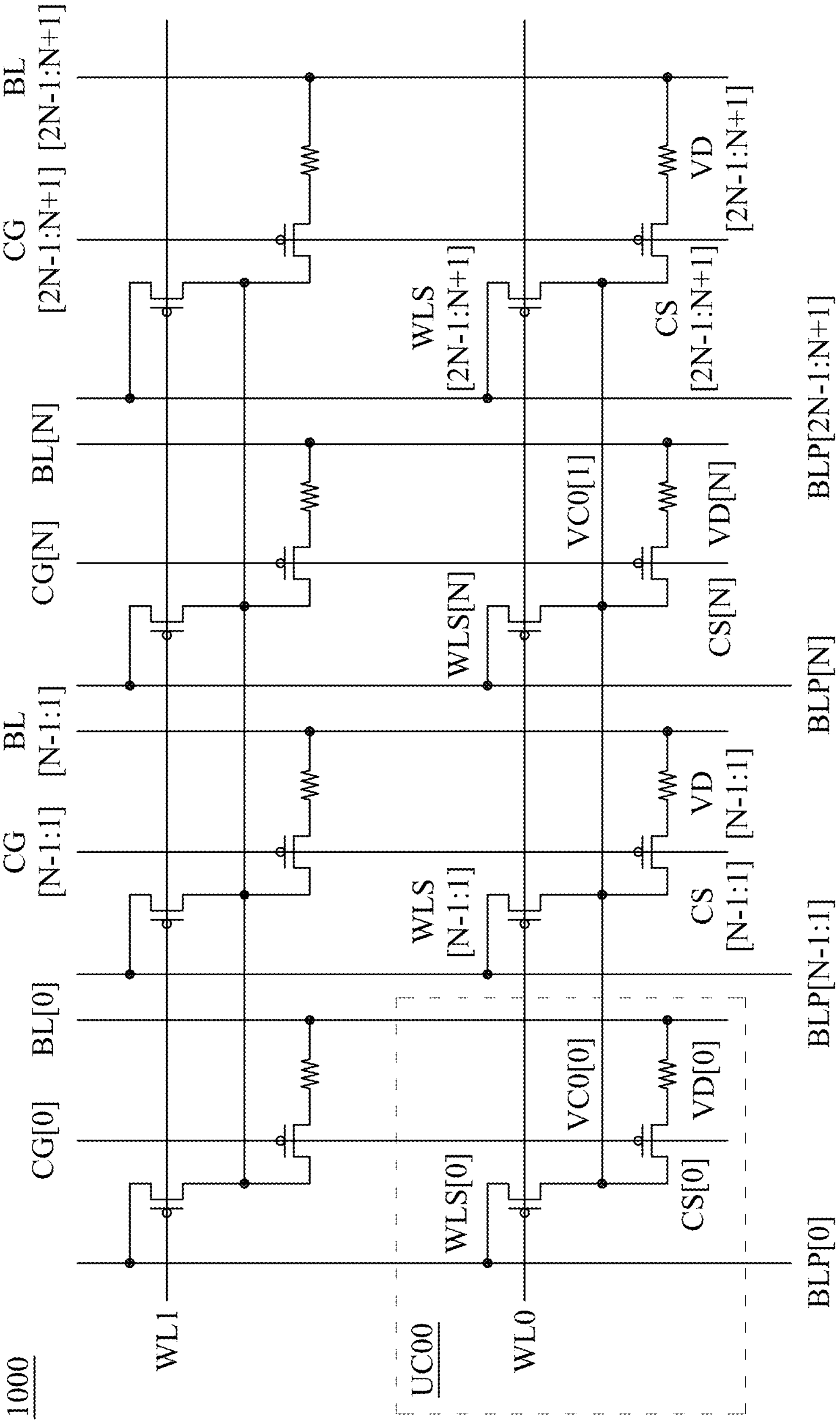
Figure 11:
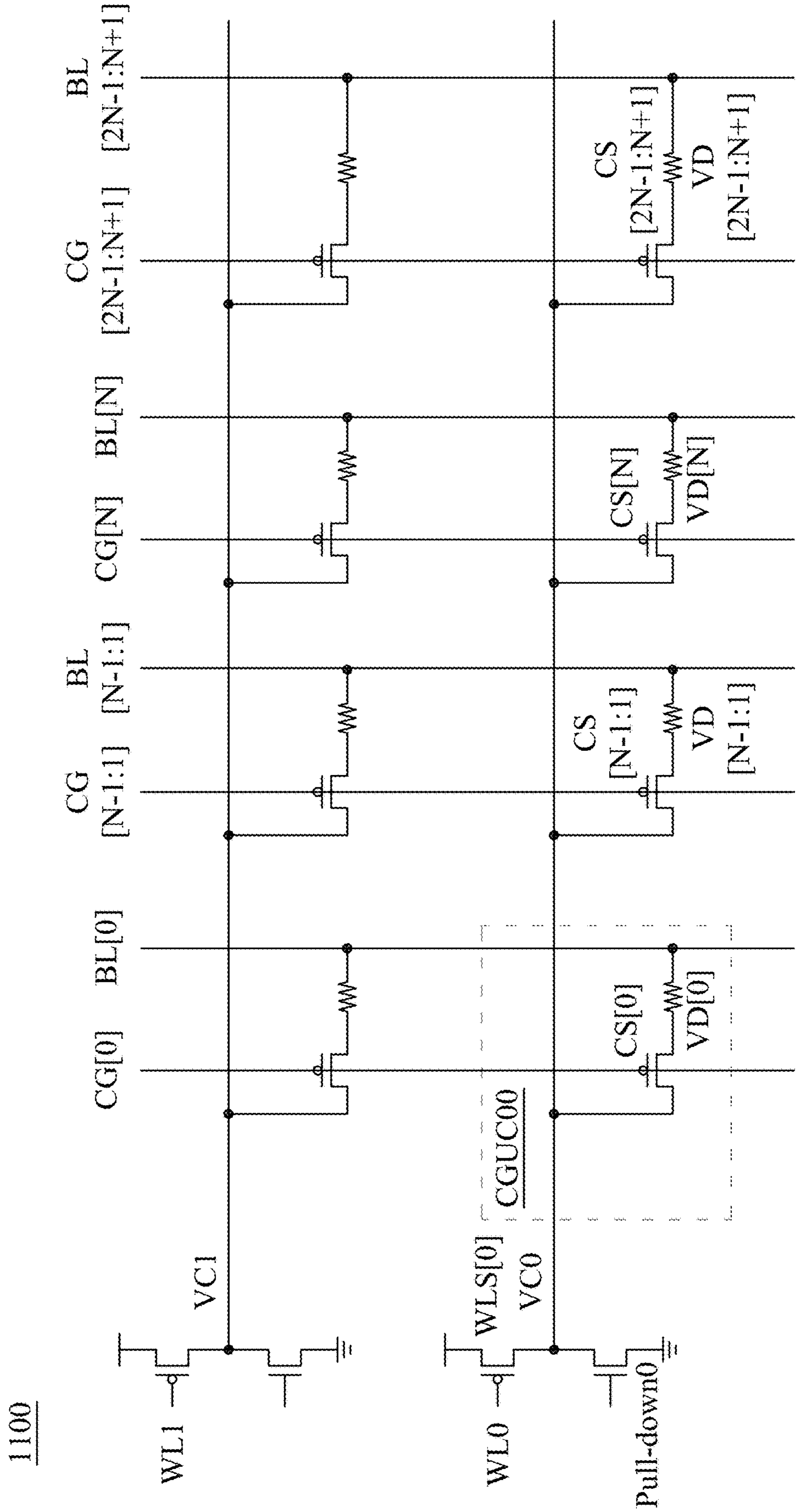
Figure 12:
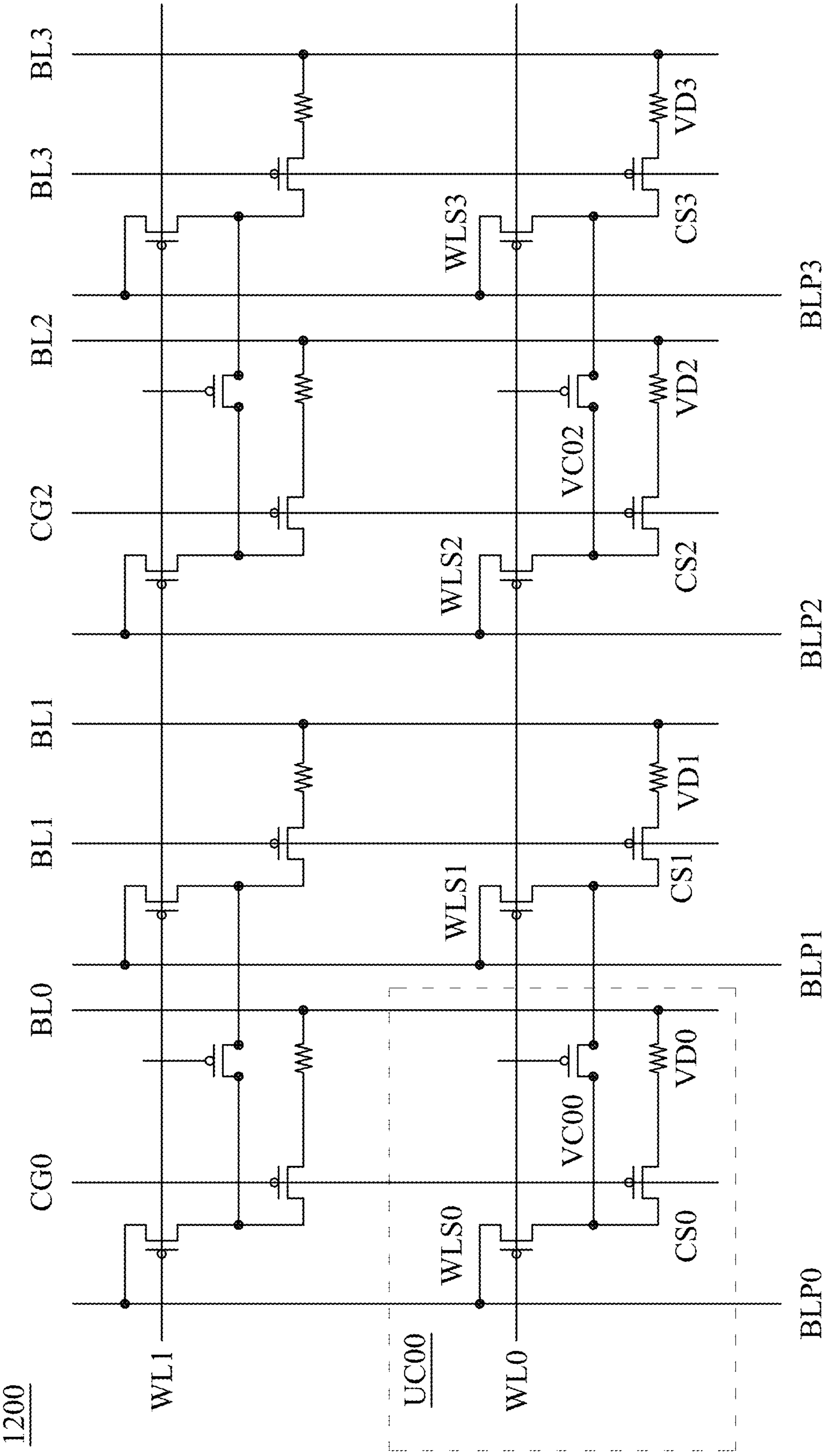
Figure 13:
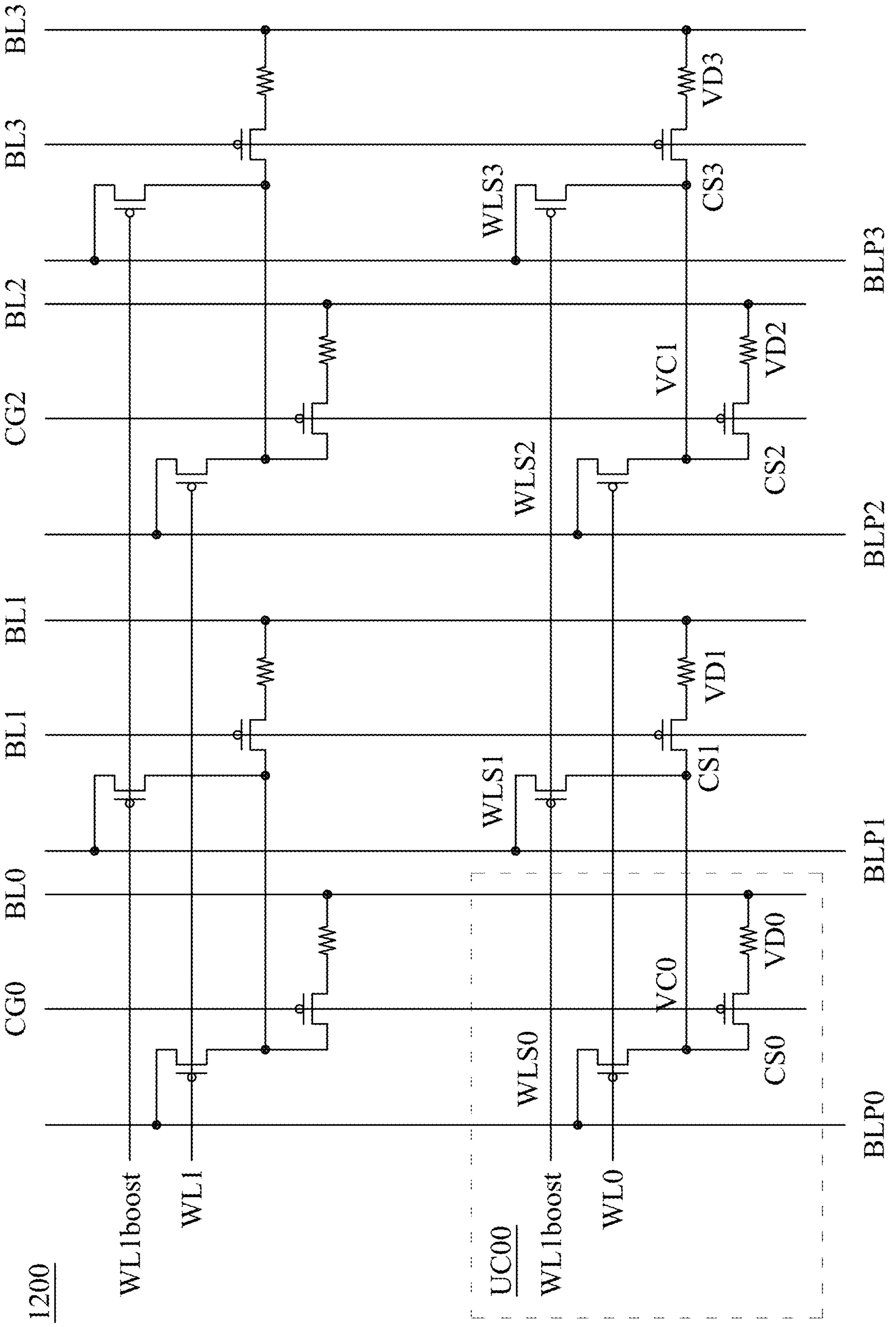

FIG. 9 illustrates a circuit diagram of the memory circuit 900, which is a PMOS implementation of the memory circuit 300 of FIG. 3A, in accordance with some embodiments of the present disclosure. FIG. 10 illustrates a circuit diagram of the memory circuit 1000, which is a PMOS implementation of the memory circuit 400 of FIG. 4, in accordance with some embodiments of the present disclosure. FIG. 11 illustrates a circuit diagram of the memory circuit 1100, which is a PMOS implementation of the memory circuit 500 of FIG. 5A, in accordance with some embodiments of the present disclosure. FIG. 12 illustrates a circuit diagram of the memory circuit 1200, which is a PMOS implementation of the memory circuit 600 of FIG. 6, in accordance with some embodiments of the present disclosure. FIG. 13 illustrates a circuit diagram of the memory circuit 1300, which is a PMOS implementation of the memory circuit 700 of FIG. 7, in accordance with some embodiments of the present disclosure.

Figure 14:
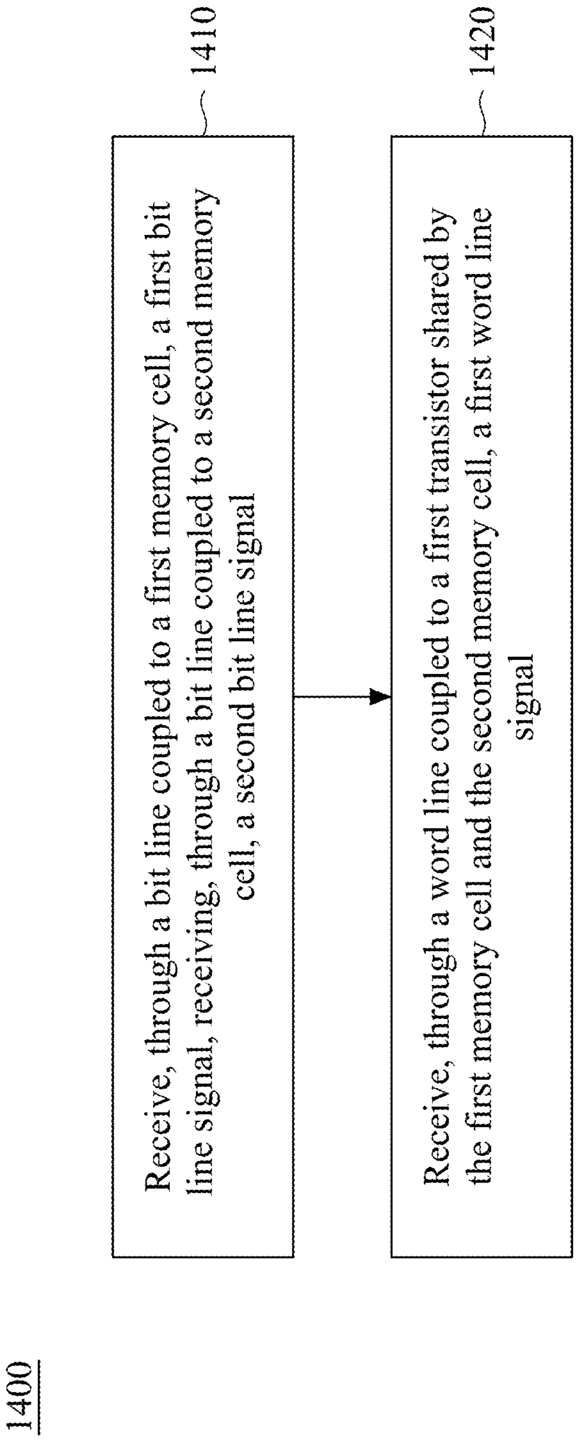
FIG. 14 illustrates a flowchart of a method to operate a memory circuit, in accordance with some embodiments of the present disclosure.

FIG. 14 illustrates a flowchart of a method 1400 to operate one or more of the memory circuits 100-1300, in accordance with some embodiments of the present disclosure. It is noted that the method 1400 is merely an example and is not intended to limit the present disclosure. Accordingly, it is understood that additional operations may be provided before, during, and after the method 1400 of FIG. 14, and that some other operations may only be briefly described herein. In some embodiments, the method 1400 is performed by one or more of the memory circuits 100-1300.

At operation 1410, a memory circuit (e.g., a memory circuit 100 of FIG. 1A) receives, through a first bit line (e.g., BL0 of FIG. 1A) coupled to a first memory cell (e.g., UC00 of FIG. 1A), a first bit line signal. At operation 1420, the memory circuit receives, through a second bit line (e.g., BL1 of FIG. 1A) coupled to a second memory cell (e.g., UC01 of FIG. 1A), a second bit line signal. At operation 1430, the memory circuit receives, through a word line (e.g., WL0 of FIG. 1A) coupled to a first transistor (e.g., WLS0 of FIG. 1A) shared by the first memory cell and the second memory cell, a first word line signal.

In some embodiments, the memory circuit receives, through a first cascode gate line (e.g., CG0 of FIG. 1A) coupled to the first memory cell, a first cascode gate signal. In some embodiments, the memory circuit receives, through a second cascode gate line (e.g., CG1 of FIG. 1A) coupled to the second memory cell, a second cascode gate signal. In some embodiments, the memory circuit receives, through a first pull-up gate line (e.g., PUL0 of FIG. 5A) coupled to the first memory cell and the second memory cell, a first pull-up gate signal.

In some embodiments, the memory circuit receives, through a switch gate line (e.g., SWL0 of FIG. 6) coupled a switch (e.g., SW0 of FIG. 6), a first switch gate signal that couples a first transistor unit of the first transistor to a second transistor unit of the second transistor, wherein the first memory cell includes the first transistor unit and the second memory cell includes the second transistor unit. In some embodiments, the memory circuit receives through a second word line (e.g., WL0boost of FIG. 7) coupled to a first transistor shared by the first memory cell and the second memory cell, a second word line signal, wherein the word line is coupled to a first transistor unit of the first transistor and the second word line is coupled to a second transistor unit of the first transistor.

In some aspects of the present disclosure, a memory circuit is disclosed. In some aspects, the memory circuit includes a first storage element coupled to a first bit line; a first transistor coupled between the first storage element and a center node; a second storage element coupled to a second bit line; a second transistor coupled between the second storage element and the center node; and a third transistor coupled between the center node and a reference node.

In some embodiments, the memory circuit includes a third storage element coupled to a third bit line; and a third transistor coupled between the third storage element and the center node.

In some embodiments, each of the first transistor and the second transistor is an N-type metal-oxide-semiconductor (NMOS) transistor, and wherein the reference node is a ground node. In some embodiments, the memory circuit includes a pull-up transistor coupled between the center node and a supply node.

In some embodiments, each of the first transistor and the second transistor is a P-type metal-oxide-semiconductor (PMOS) transistor, and wherein the reference node is a supply node. In some embodiments, the memory circuit includes a pull-down transistor coupled between the center node and a ground node.

In some embodiments, each of the first storage element and the second storage element is a resistor. In some embodiments, each of the first storage element and the second storage element is a capacitor.

In some embodiments, the first transistor is coupled to a first cascode gate line, the second transistor is coupled to a second cascode gate line, and the third transistor is coupled to a word line. In some embodiments, the first transistor and the third transistor are a same size. In some embodiments, the first transistor is smaller than the third transistor.

In some aspects of the present disclosure, a method for operating a memory device is disclosed. In some aspects, the method includes receiving, through a first bit line coupled to a first memory cell, a first bit line signal; receiving, through a second bit line coupled to a second memory cell, a second bit line signal; and receiving, through a word line coupled to a first transistor shared by the first memory cell and the second memory cell, a first word line signal.

In some embodiments, the method includes receiving, through a first cascode gate line coupled to the first memory cell, a first cascode gate signal; and receiving, through a second cascode gate line coupled to the second memory cell, a second cascode gate signal. In some embodiments, the method includes receiving, through a first pull-up gate line coupled to the first memory cell and the second memory cell, a first pull-up gate signal.

In some embodiments, the method includes receiving, through a switch gate line coupled a switch, a first switch gate signal that couples a first transistor unit of the first transistor to a second transistor unit of the second transistor, wherein the first memory cell includes the first transistor unit and the second memory cell includes the second transistor unit. In some embodiments, the method includes receiving, through a second word line coupled to a first transistor shared by the first memory cell and the second memory cell, a second word line signal, wherein the word line is coupled to a first transistor unit of the first transistor and the second word line is coupled to a second transistor unit of the first transistor.

In some aspects of the present disclosure, memory device is disclosed. In some aspects, the memory device includes a first memory cell and a second memory cell. In some embodiments, each of the first memory cell and the second memory cell includes a plurality of active structures extending along a first lateral direction. In some embodiments, a first portion of the plurality of active structures define a first signal node. In some embodiments, a second portion of the plurality of active structures define a second signal node. In some embodiments, a third portion of the plurality of active structures define a first reference node.

In some embodiments, each of the first memory cell and the second memory cell includes a plurality of gate-defined (GD) structures extending along a second lateral direction perpendicular to the first lateral direction. In some embodiments, the plurality of GD structures is disposed over the plurality of active structures. In some embodiments, a first number of the plurality of GD structures is coupled to a word line and a second number of the plurality of GD structures is coupled to a cascode gate line.

In some embodiments, each of the first memory cell and the second memory cell includes a first conductive structure extending along the first lateral direction. In some embodiments, the first conductive structure is disposed over the second portion of the plurality of active structures. In some embodiments, the first conductive structure of the first memory cell is coupled to the first conductive structure of the second memory cell.

In some embodiments, each of the first memory cell and the second memory cell includes a fuse link extending in the first direction. In some embodiments, the fuse link is coupled to a bit line. In some embodiments, each of the first memory cell and the second memory cell includes a second conductive structure extending in the second direction, In some embodiments, the second conductive structure is disposed over the fuse link and the first portion of the plurality of active structures.

In some embodiments, a ratio of the first number of the plurality of GD structures and the second number of the plurality of GD structures is greater than 1. In some embodiments, a ratio of the first number of the plurality of GD structures and the second number of the plurality of GD structures is greater than 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for operating a memory device, comprising:
- receiving, through a first bit line coupled to a first memory cell, a first bit line signal;
- receiving, through a second bit line coupled to a second memory cell, a second bit line signal;
- receiving, through a word line coupled to a common transistor shared by the first memory cell and the second memory cell, a word line signal;
- receiving, through a first cascode gate line coupled to the first memory cell, a first cascode gate signal; and
- receiving, through a second cascode gate line coupled to the second memory cell, a second cascode gate signal.

2. The method of claim 1, wherein the first memory cell includes a first storage element and a first transistor, and the second memory cell includes a second storage element and a second transistor.

3. The method of claim 2, wherein the first transistor has a first source/drain connected to the first storage element and a second source/drain connected to a center node, and the second transistor has a first source/drain connected to the second storage element and a second source/drain connected to the center node.

4. The method of claim 3, wherein the common transistor connected between the center node and a reference node.

5. The method of claim 4, each of the first transistor and the second transistor is an N-type metal-oxide-semiconductor (NMOS) transistor, and wherein the reference node is a ground node.

6. The method of claim 2, wherein each of the first storage element and the second storage element is a resistor.

7. The method of claim 2, wherein each of the first storage element and the second storage element is a capacitor.

8. The method of claim 1, further comprising:

receiving, through a pull-up gate line coupled to the first memory cell and the second memory cell, a pull-up gate signal.

9. A method for operating a memory device, comprising:

receiving, through a first bit line coupled to a first memory cell including a first transistor and a first storage element, a first bit line signal;

receiving, through a second bit line coupled to a second memory cell including a second transistor and a second storage element, a second bit line signal; and receiving, through a word line coupled to a common transistor shared by the first memory cell and the second memory cell, a word line signal;

wherein the first memory cell is coupled between the first bit line and a center node, the second memory cell is coupled between the second bit line and the center node, and the common transistor is connected between the center node and a reference node.

10. The method of claim 9, wherein a first end of the first storage element is connected to the first bit line and a second end of the first storage element is connected to a first source/drain of the first transistor, and wherein a first end of the second storage element is connected to the second bit line and a second end of the second storage element is connected to a first source/drain of the second transistor.

11. The method of claim 10, wherein the first transistor has a second source/drain connected to the center node, and the second transistor has a second source/drain connected to the center node.

12. The method of claim 11, wherein the common transistor includes a first source/drain connected to the center node and a second source/drain connected to the reference node.

13. The method of claim 12, each of the first transistor and the second transistor is an N-type metal-oxide-semiconductor (NMOS) transistor, and wherein the reference node is a ground node.

14. The method of claim 1, further comprising:

receiving, through a first cascode gate line coupled to the first memory cell, a first cascode gate signal; and receiving, through a second cascode gate line coupled to the second memory cell, a second cascode gate signal.

15. The method of claim 9, wherein each of the first storage element and the second storage element is a resistor.

16. The method of claim 9, wherein each of the first storage element and the second storage element is a capacitor.

17. A method for operating a memory device, comprising:

receiving, through a first bit line coupled to a first memory cell including a first transistor and a first storage element, a first bit line signal;

receiving, through a second bit line coupled to a second memory cell including a second transistor and a second storage element, a second bit line signal; and receiving, through a word line coupled to a common transistor shared by the first memory cell and the second memory cell, a word line signal;

wherein the first memory cell is coupled between the first bit line and a first source/drain of the common transistor, the second memory cell is coupled between the second bit line and the first source/drain of the common transistor, and a second source/drain of the common transistor is connected to a ground node.

18. The method of claim 17, wherein each of the first storage element and the second storage element is a resistor.

19. The method of claim 17, wherein each of the first storage element and the second storage element is a capacitor.

20. The method of claim 17, further comprising:

receiving, through a first cascode gate line coupled to the first memory cell, a first cascode gate signal; and receiving, through a second cascode gate line coupled to the second memory cell, a second cascode gate signal.

* * * * *